United States Patent
Scott et al.

(10) Patent No.: US 7,029,508 B2
(45) Date of Patent: Apr. 18, 2006

(54) CATALYST ATTACHED TO SOLID AND USED TO PROMOTE FREE RADICAL FORMATION IN CMP FORMULATIONS

(75) Inventors: Brandon Shane Scott, Castro Valley, CA (US); Robert J. Small, Hayward, CA (US)

(73) Assignee: DuPont Air Products NanoMaterials L.L.C., Tempe, AZ (US)

( * ) Notice: Subject to any disclaimer, the term of this patent is extended or adjusted under 35 U.S.C. 154(b) by 43 days.

(21) Appl. No.: 10/361,822

(22) Filed: Feb. 11, 2003

(65) Prior Publication Data

US 2004/0006924 A1 Jan. 15, 2004

Related U.S. Application Data

(63) Continuation-in-part of application No. 10/074,757, filed on Feb. 11, 2002, now abandoned.

(51) Int. Cl.
*C09G 1/02* (2006.01)
*C09G 1/04* (2006.01)
*B24B 1/00* (2006.01)

(52) U.S. Cl. .............................. 51/307; 51/308; 51/309; 106/3; 438/692; 438/693

(58) Field of Classification Search ................... 51/307, 51/308, 309; 106/3; 438/692, 693
See application file for complete search history.

(56) References Cited

U.S. PATENT DOCUMENTS

| | | | | |
|---|---|---|---|---|
| 5,302,356 | A | * | 4/1994 | Shadman et al. ......... 422/186.3 |
| 6,022,400 | A | | 2/2000 | Izumi et al. |
| 6,177,026 | B1 | | 1/2001 | Wang et al. |
| 6,251,150 | B1 | | 6/2001 | Small et al. |
| 6,375,545 | B1 | * | 4/2002 | Yano et al. ................... 451/36 |
| 6,435,947 | B1 | * | 8/2002 | Mueller et al. ................ 451/41 |
| 6,461,227 | B1 | * | 10/2002 | Fang ........................... 451/41 |
| 6,468,428 | B1 | * | 10/2002 | Nishii et al. ............. 210/497.3 |
| 2002/0017063 | A1 | * | 2/2002 | Beitel et al. ................... 51/307 |

* cited by examiner

*Primary Examiner*—Michael Marcheschi
(74) *Attorney, Agent, or Firm*—Morgan, Lewis & Bockius LLP

(57) ABSTRACT

The present invention provides a composition for chemical-mechanical polishing which comprises at least one abrasive particle having a surface at least partially coated by a activator. The activator comprises a metal other than a metal of Group 4(b), Group 5(b) or Group 6(b). The composition further comprises at least one oxidizing agent. The composition is believed to be effective by virtue of the interaction between the activator coated on the surface of the abrasive particles and the oxidizing agent, at the activator surface, to form free radicals. The invention further provides a method that employs the composition in the polishing of a feature or layer, such as a metal film, on a substrate surface. The invention additionally provides a substrate produced this method.

86 Claims, No Drawings

CATALYST ATTACHED TO SOLID AND USED TO PROMOTE FREE RADICAL FORMATION IN CMP FORMULATIONS

CROSS-REFERENCE TO RELATED APPLICATIONS

This application is a continuation-in-part of U.S. applicationl Ser. No. 10/074,757 filed Feb. 11, 2002, now abandoned, the entire contents of which is incorporated herein by express reference thereto.

STATEMENT REGARDING FEDERALLY SPONSORED RESEARCH OR DEVELOPMENT

Not Applicable.

INCORPORATION-BY-REFERENCE OF MATERIAL SUBMITTED ON A COMPACT DISC

Not Applicable.

SEQUENCE LISTING

Not Applicable.

FIELD OF THE INVENTION

The invention relates generally to a system that is useful in chemical mechanical polishing (hereafter CMP) processes, and an associated method of polishing a substrate using one or more parts of the system. More particularly, in one embodiment, the invention relates to a composition comprising a free radical-producing oxidizing agent, and a free radical-producing activator which is affixed to a solid in contact with the composition. In another embodiment, the invention relates to a non-metallic free radical-producing activator which is in solution, a free radical-producing oxidizing agent, and optionally a free radical-producing activator which is affixed to a solid. The composition is useful in the polishing of various layers, such as metal layers, on substrates.

BACKGROUND OF THE INVENTION

A semiconductor wafer, such as a silicon or a gallium arsenide wafer, generally has a substrate surface on which one or more integrated circuits is formed. The substrate surface is desirably as flat, or planar, as possible before the surface is processed to form the integrated circuits. A variety of semiconductor processes are used to form the integrated circuits on the flat surface, during which the wafer takes on a defined topography. The topography is subsequently planarized, because an irregular surface, or a surface having imperfections, seriously impedes subsequent fabrication processes, such as photolithography. Thus, it is necessary to polish the wafer surface to render it as planar or uniform as possible and to remove surface imperfections.

Chemical-mechanical polishing or planarization (CMP) processes are well-known. See, for example, Chemical Mechanical Polishing in Silicon Processing, Semiconductors and Semimetals, Vol. 62, Edited by Li, S. et al., which is expressly incorporated herein by reference. Also directly incorporated by reference for all purposes are commonly assigned:

U.S. Pat. No. 5,891,205 to Picardi et al., which issued on Apr. 6, 1999, entitled Chemical Mechanical Polishing Composition;

U.S. Pat. No. 5,981,454 to Small, which issued on Nov. 9, 1999, entitled Post Clean Treatment Composition Comprising An Organic Acid And Hydroxylamine;

U.S. Pat. No. 6,117,783 to Small et al., which issued on Sep. 12, 2000, entitled Chemical Mechanical Polishing Composition And Process;

U.S. Pat. No. 6,156,661 to Small, which issued on Dec. 5, 2000, entitled Post Clean Treatment;

U.S. Pat. No. 6,235,693 to Cheng et al., which issued on May 22, 2001, entitled Lactam Compositions For Cleaning Organic And Plasma Etched Residues For Semiconductor Devices;

U.S. Pat. No. 6,248,704 to Small et al., which issued on Jun. 19, 2001, entitled Compositions For Cleaning Organic And Plasma Etched Residues For Semiconductors Devices;

U.S. Pat. No. 6,251,150 to Small et al., which issued on Jun. 26, 2001, entitled Slurry Composition And Method Of Chemical Mechanical Polishing Using Same;

U.S. Pat. No. 6,313,039 to Small et al., which issued on Nov. 6, 2001, entitled Chemical Mechanical Polishing Composition And Process; and U.S. Pat. No. 6,498,131 to Small et al., which issued on Dec. 24, 2002, entitled Composition For Cleaning Chemical Mechanical Planarization Apparatus.

CMP processes are commonly used to polish or "planarize" the surfaces of wafers at various stages of fabrication to improve wafer yield, performance and reliability. In CMP, typically the wafer is held in place on a mount using negative pressure, such as vacuum, or hydrostatic or pneumatic pressure. The mount is typically situated over a polishing pad. CMP generally involves applying a polishing composition or slurry to the polishing pad, establishing pressure-contact between the composition- or slurry-coated wafer surface and the polishing pad while providing relative motion, typically rotational or orbital motion, between the wafer surface and the polishing pad.

The polishing composition typically contains an abrasive material, such as silica, ceria, and/or alumina particles, in an acidic, neutral, or basic solution. Merely by way of example, a polishing composition useful in the CMP of tungsten material on a substrate may contain abrasive alumina, also called aluminum oxide, an oxidizing agent such as hydrogen peroxide, and either potassium hydroxide or ammonium hydroxide. A CMP process employing such a polishing composition may provide a predictable rate of polishing, while largely preserving desirable features on the wafer surface.

For such a semiconductor wafer, a typical CMP process involves polishing the metal in a controlled manner to preferentially etch certain conductors, insulators or both over the the oxide beneath the metal, such that the metal is substantially coplanar with the oxide and remains in the grooves or stud vias of the oxide. After CMP, the substantially coplanar surface is ready for further processing. CMP is currently the primary method used to polish or "planarize" wafers in back end of the line (BEOL) processes.

Semiconductor fabrication processes such as photolithography have evolved significantly, such that advanced devices having very fine oxide, metal, and other surface features, with sub-0.25 micron geometries (such as 0.18 micron or less), are now being made. Process tolerances are necessarily tighter for these advanced devices, calling for improvements in CMP technology to obtain desired material removal rates while minimizing wafer defects or damage. A variety of approaches have been taken in an effort to improve CMP processes to improve planarity.

On the other hand, economic forces are requiring the use of faster processing. One approach has involved increasing the downward pressure on the wafer carrier in order to increase material removal rates. This approach is generally disfavored as the requisite downward pressure is considered too high and too likely to cause wafer damage, such as scratching, delamination, or destruction of material layers on the wafer. When the wafer is fragile, as is generally the case with substrates layered with films such as porous films having a low dielectric constant, these damage issues are particularly acute and detrimental in terms of wafer yield and performance. Generally, faster chemical-mechanical polishing results in more defects.

Additional approaches have involved using various protected combinations of oxidizers, chelators, corrosion inhibitors, solvents, and other chemicals in the slurry, various abrasives including for example a zirconium abrasive or mixed abrasives, and/or using point-of-use mixing techniques. These approaches are generally undesirable, as they typically complicate CMP in terms of tooling and process control for example, consume more process time, and/or increase costs.

Another approach has involved increasing the amount of oxidizing agent used in the CMP slurry in an effort to increase chemical removal of targeted material. This approach is largely disfavored as the use of increased amounts of oxidizing agents increase material costs and also detrimentally add to the handling issues and environmental issues associated with many oxidizing agents and also increase costs.

It is generally known that oxidizers admixed in a solution can provide synergistic etching rates. While ferric salts, cerium salts, peroxides, persulfates, or hydroxylamines form the oxidizing capacity of most commercially available CMP slurries, those of ordinary skill in the art have long known that these oxidizers can be admixed with others in this group and also with other oxidizers, and the resulting composition can show synergistic results.

For example, the compositions claimed in U.S. Pat. No. 6,117,783 to Small et al., which claims priority to a provisional application filed Jul. 25, 1996, the contents of which is incorporated herein by reference thereto, claims a CMP slurry having a hydroxylamine compound and hydrogen peroxide, and teaches in the specification that the two have a synergistic effect. U.S. Pat. No. 6,117,783 also claims a CMP slurry having a hydroxylamine compound and ammonium bifluoride. These are mixtures of non-metal-containing oxidizers that provide synergistic results. Similarly, U.S. Pat. No. 5,783,489, the disclosure of which is incorporated herein by reference thereto, discloses an aqueous CMP slurry comprising at least two oxidizing agents, an organic acid and an abrasive having a pH ranging from about 2.0 to about 8.0.

Without being bound to theory, it is believed that certain metal salt oxidizers have a greater oxidizing "probability" than non-metal-containing oxidizers, which may be based at least in part on affinity of the oxidizer to the substrate. Greater affinity enhances the possibility of oxidation but also creates a problem in that the molecule with the greater affinity does not as readily leave the substrate after oxidizing the substrate as other oxidizers. Synergy with metal-containing and non-metal-containing oxidizers may be observed if the other, typically non-metal-containing, oxidizers can oxidize spent oxidizer that is near or on the substrate, such that reaction with the substrate would be fast. Following this line of reasoning, it stands to reason that it is beneficial to have some minimum amount of the metal, to have enough metal-containing oxidizer ions near the surface, but a large excess of the non-metal-containing oxidizer would be beneficial to more quickly re-oxidize the spent metal-containing oxidizer.

Of course, the soluble salt of any metal having multiple oxidation states may be an oxidizer, provided they have the oxidative potential to oxidize the substrate. Metal-containing oxidizers such as permanganate, perchromate, iron salts, aluminum salts, cerium salts, and the like are commonly used in CMP slurries, and synergistic combinations of the metal-containing oxidizers as well as of metal-containing and non-metal-containing oxidizers is also known. CMP of certain metal substrates, for example a copper-containing substrate, will doubtless provide metals, for example cupric and/or cuprous metal ions, in the solution, but these will not oxidize the remaining copper layer. If there are two different metals, however, the oxidized and removed ion of one metal may in turn be an oxidizing metal for another metal, but the amount will be very small.

U.S. Pat. No. 4,959,113, reissued, filed on Jul. 31, 1989, the disclosure of which is incorporated herein by reference thereto, claims synergistic CMP slurries having two or more salts where the cations are selected from ionized elements (i.e., metals) which will not deposit by electroless plating on the metal surface being polished. This patent states "preferred cationic component of the salt is an ionized element from Groups IIA, IIIA, IVA and IVB of the periodic table of elements, as well as zinc, cerium, tin and iron ions . . . (and) an aqueous polishing composition comprising a combination of salts with the water and abrasive agent provides improved polishing of metal surfaces compared to the use of a single salt. Thus, there appears to be a synergistic effect when a combination of two or more salts is used in the polishing composition compared to the use of a single salt."

One metal-containing oxidizing agent used in CMP is silver nitrate. Silver nitrate and hydrogen peroxide are present in the CMP slurry of U.S. Pat. No. 5,354,490, the contents of which is incorporated herein by reference thereto. Synergy is taught, as the patent stated the silver nitrate converts, at the copper containing metal surface, a solid copper film or a solid copper alloy film into an aqueous phase, while the role of the second oxidizing agent, i.e., hydrogen peroxide, would be to form a copper oxide. The copper oxide would be subsequently removed by the mechanical polishing of the CMP action, such that the addition of the second oxidizing agent can increase the mechanical polishing component of the CMP process.

Another metal-containing oxidizing agent commonly used in CMP is ferric nitrate. U.S. Pat. No. 5,527,423, the contents of which is incorporated herein by reference thereto, teaches a CMP slurry that contains oxidizing components such as mixtures of iron salts and persulfates. Ferric nitrate has been used extensively where tungsten metal or alloys present on the substrate require polishing.

However, ferric nitrate causes metallic contamination of many substrates, including tungsten substrates. Raghunath et al showed in Mechanistic Aspects Of Chemical Mechanical Polishing Of Tungsten Using Ferric Ion Based Alumina Slurries, in the Proceedings of the First International Symposium on Chemical Mechanical Planarization, 1997, that alumina slurries containing ferric salts is conducive to the formation of an insoluble layer of ferrous tungstate on tungsten. The addition of hydrogen peroxide to ferric ion solutions is known. Basak et al., in the same Proceedings of the First International Symposium on Chemical Mechanical Planarization: Proceedings of Chemical Mechanical Planarization in IC Device Manufacturing, 1997, noted that the electrochemical behaviour of tungsten in solutions containing ferric nitrate revealed the presence of ferric ions increases the open circuit potential of W into the regime where oxide films are stable, but anodic currents increased by at least one order of magnitude on addition of hydrogen peroxide.

Some investigators call small quantities of metal-containing oxidizer salts a catalyst as it causes synergistic etching rates when admixed with other oxidizers. See for example U.S. Pat. No. 3,293,093, the disclosure of which is incorporated herein by reference, which teaches a hydrogen peroxide-based etching solution for copper. The patentees noted that many metals, particularly copper ions, "form active metal ions which have been found to have a highly depreciating effect on hydrogen peroxide (so) that it is rapidly exhausted" These investigators wanted to arrest the depreciating effect of metal ions and yet to provide compounds having a catalytic effect on the etch rate of copper. They noted that a small amount of silver ions, and preferably also a small amount of phenacetin, gave enhanced etching and stability. This patent taught a solution having 2–12% hydrogen peroxide and a "catalytic amount" of silver ions, as silver ions are highly effective at improving the etch rate of hydrogen peroxide, and suggests adding silver nitrate salts. A combination of phenacetin and silver ions with acidified hydrogen peroxide exhibits "exceptionally fast etch rates significantly greater than when either additive is used alone." The patent claims "as little as 10 parts per million" of silver ions is effective, and "about 50–500 parts per million of free silver ion generally represents the preferred amount." A composition of ammonium persulfate and a mercuric chloride catalyst was also taught in this patent.

Other investigators have also tried to mix oxidizers to achieve synergy. U.S. Pat. No. 5,958,288, the disclosure of which is incorporated herein by reference, suggests limiting the amount of "catalyst" to from about 0.001 to about 2.0 weight percent. This patent describes the catalyst as a compound having multiple oxidation states, and that the catalyst must be able to shuffle electrons efficiently and rapidly between the oxidizer and metal substrate surface. While this broad description of a catalyst encompasses any oxidizer, including any metal salt, the only catalysts described therein are metal salt compounds of Ag, Co, Cr, Cu, Fe, Mo, Mn, Nb, Ni, Os, Pd, Ru, Sn, Ti, and V, most preferably a compound of iron, copper, and/or silver. This patent defines the oxidizing agent to have an electrochemical potential greater than the electrochemical potential necessary to oxidize the catalyst, including but are not limited to periodic acid, periodate salts, perbromic acid, perbromate salts, perchloric acid, perchloric salts, perboric acid, and perborate salts and permanganates, as well as bromates, chlorates, chromates, iodates, iodic acid, and cerium (IV) compounds.

As shown in the above-described art, cerium salts are another metal-containing oxidizer. U.S. Pat. No. 4,769,073, the contents of which is incorporated herein by reference thereto, describes cerium-based polishing compositions for polishing organic glass surfaces which comprise ceric oxide, a cerous salt, and, optionally, pyrosilicates or silica. Similarly, U.S. Pat. No. 5,773,364 filed Oct. 21, 1996, the contents of which is incorporated herein by reference thereto, describes a CMP slurry where oxidizers include ferric nitrate or cerium nitrate, and note the problem that metal ions are created as a result of the oxidizing process. Cerium salts can contaminate an exposed surface of a semiconductor wafer which could affect the reliability and functionality of semiconductor devices on the wafer. In addition, these metallic species will coat/stain the CMP equipment which creates particulate problems and reduces the life cycle of the CMP equipment. This in turn causes increased replacement of polishing equipment and greater cost associated with the manufacturing process.

There is another mechanism for synergy that has not been described in the CMP art, but is known in the unrelated environmental clean-up art. A reaction used in environmental remediation systems is Fenton's reaction, where the relatively benign reactants generate a free radical which can cleave even very resistant organic contaminants.

Fenton's reaction is the interaction of hydrogen peroxide with selected transition metals to produce free radicals. The interaction of copper or a ferrous salt iron and hydrogen peroxide to produce a free radical was first observed by Fenton in 1876. The Fenton reaction is the production of free radicals as a byproduct of the oxidation of ferrous ions by hydrogen peroxide. Other metals are known to have special oxygen transfer properties which improve the utility of hydrogen peroxide.

The optimal pH for Fenton's reaction occurs between pH 3 and pH 6, particularly 4 to 5. The drop in efficiency on the basic side is attributed to the transition of iron from a hydrated ferrous ion to a colloidal ferric species which catalytically decomposes the hydrogen peroxide into oxygen and water, without forming hydroxyl radicals. Fenton's reactions where the iron and the hydrogen peroxide are in solution are characterized by an optimal dose range for iron activator. A minimal threshold concentration of 3–15 mg/L Fe which allows the reaction to proceed within a reasonable period of time for the digestion of organic material in wastewater, and generally a ratio of 1 part Fe per 5–25 parts hydrogen peroxide (wt/wt) is most efficient. For a solution containing organic material to be degraded, to obtain efficient Fenton's reaction kinetics, addition of 5% by weight hydrogen peroxide would also require between about 0.2% to 1% ferrous ions in the solution.

It is also known that UV light can enhance the efficiency of Fenton's reaction, and that some activators need actinic radiation to be operative. For example, U.S. Pat. Nos. 6,117,026 and 6,435,947, the disclosure of which is incorporated herein by reference, describe a heterogeneous solid metal oxide catalyst that can be a homogeneous composition of the active catalyst, or the active heterogeneous solid catalyst can be chemically or physically associated with the surface of the preferred abrasive as molecular species, as a small particle or as a monolayer. The solid catalysts are preferably small particles with high surface areas. The solid catalysts should have a mean particle diameter less than about 1 micron and a surface area greater that about 10 m.sup.2/g and less than about 250 m.sup.2/g. It is more preferred that the solid catalysts have a mean particle diameter that is less than about 0.5 microns and most preferably less than about 0.25 microns.

As mentioned in U.S. Pat. Nos. 5,773,364, 4,959,113, and others, there are problems with the metal-containing oxidizers. When a metal-containing oxidizer is admixed with another metal-containing oxidizer, there is a possibility of plating of one of the metals due to the differences in electrochemical potential of the various metals at the various oxidation states, particularly as the solution is consumed during polishing of a substrate. While plating was recognized as problematic in the U.S. Pat. No. 4,959,113, there is a further possibility that as the metal-containing oxidizers change oxidation states, even some "non-plating" combinations may become plating.

Another problem with many metal compounds is that they react with and cause degradation of other oxidizers. When a metal-containing oxidizer is admixed with a non-metalcontaining oxidizer, for example hydrogen peroxide in a solution, the two often react in an undesirable fashion, and the oxidizing capacity of the mixture declines rapidly with time. The nature of the reaction can take many forms. For example, ferric nitrate reacts with hydrogen peroxide in CMP formulations at essentially all usable pHs, making the formulation oxidizing capacity fall with time, which complicates polishing since there is a non-uniformity problem, and also causing formation of undesired products. It is known that if the pH is above about 5, iron precipitates as $Fe(OH)_3$ which catalytically decomposes the hydrogen peroxide to oxygen. The mechanism for decomposition at pH below 5 is not known.

Another problem with metal-containing oxidizer salts is that they leave metal contamination on the substrate. This metallic contamination can result in shorts and unwanted conductive properties, along with other problems. Metal contamination was recognized in U.S. Pat. No. 5,445,996, filed May 25, 1993, the contents of which is incorporated herein by reference thereto, describes use of a polishing slurry for polishing and planarizing the semiconductor device that contains less than 100 ppm impurities such as sodium, potassium, and other alkali metals.

Certain metals, such as those with a tendency to plate on or be absorbed on to at least one part of the substrate, are more damaging than other metals. The industry has developed methods to remove a portion of the metallic contamination, for example by: physical desorption by solvents; changing the surface charge with either acids or bases so that Si—OH or M—OH group can be protonated (made positive) in acid or made negative with bases by removing the proton; ion competition, for example removing adsorbed metal ions by adding acid (i.e. ion exchange); subsequent oxidation of metals to change the chemical bonds between the impurities and substrate surface; and subsequent etching the surface, wherein the impurity and a certain thickness of the substrate surface is removed, as described in U.S. Pat. No. 6,313,039, the contents of which has been incorporated herein by reference. There have been various "postpolishing cleaners" developed to remove metallic contamination, but removal of all undesired metal ions is substantially beyond the range of cleaners, and as the size of the structures continues to decrease, even a very small number of metallic atoms deposited on a surface will result in undesired shorts or current leakage.

Additionally, metal ion-containing fluids are often environmentally undesirable and expensive treatment may be needed prior to waste disposal of used product.

Therefore, despite the known (and heretofore unknown) advantages of having multiple oxidizers, for example a metal-containing oxidizer admixed with either another metal-containing oxidizer or with a non-metal-containing oxidizer, there has been a tendency in the industry to reduce the amount of metal ions in CMP slurries. For example, Rodel, a large commercial manufacturer of CMP slurries that at point of use are designed to be used with non-metal-containing oxidizers such as peroxides and persulfates, had about 30 ppm of metals, primarily iron, in the liquid portion of an MSW1000™ slurry produced in 1995. While this iron would have functioned as a promoter, it is likely the iron was in the solution as a result of impurities. Later generations of Rodel slurries, for example the Rodel MSW1500™ slurry that was sold in 2002, has only 4.2 ppm iron.

Another method of reducing metallic contamination is to use sequential CMP polishing steps using sequential formulations that have decreasing amounts of metal, so that metal deposited from earlier formulations in a CMP process are removed by CMP with subsequent formulations that are metal-free. For example, the newest generation of Rodel CMP slurries, the MSW2000™, has a first formulation (A) having 12 ppm Fe, and a second formulation (B) that has less than 0.3 ppm Fe. However, use of sequential formulations adds additional costs to processing, as well as adding complexity to the required equipment. Cabot Corporation, another large commercial manufacturer of CMP slurries, now sells several high-purity, nonmetal-based CMP slurries for tungsten, such as the Semi-Sperse® W2000 and the Semi-Sperse® W2585 slurries, claiming that the slurries eliminate the secondary-polishing steps associated with existing tungsten slurries.

EKC Technology/Dupont Electronic Technologies, another large commercial manufacturer of CMP slurries, sells several high-purity, non-metal-based CMP slurries for tungsten, for example the MicroPlanar® CMP3550™/MicroPlanar® CMP3510™ slurry, as well as the traditional but effective ferric nitrate as the oxidizer with a post-CMP cleaner to remove metal contaminants.

It is clear that the industry is moving away from metals, for example iron, in the fluids. Also, when iron or other metal-containing formulation is admixed with non-metal-containing oxidizers, the "pot-life" of the formulation is very short, so mixing is generally point-of-use mixing, which complicates CMP processes and equipment and can create start-up problems even after a temporary interruption on the processing.

Further developments in the field of CMP technology are desired.

SUMMARY OF THE INVENTION

This invention relates to a method of making selected oxidizers or other free radical-producing compounds become more effective chemical etchants and/or oxidizers for CMP activities by promoting the formation of the free radicals in a CMP composition with one or more activators. The composition of the present invention is effective in the CMP of a variety of metal or metal alloy materials on substrates such as silicon or semiconductor substrates. Without being bound by theory, it is believed that the activator coated abrasive and the oxidizing agent react at the surface interface to generate free radicals that are effective intermediates in the reaction between the oxidizing agent and the material targeted for removal from the substrate surface. Further, it is believed that the activator coated abrasive is particularly effective as it brings the activator in close proximity to the targeted material on the substrate surface, and thus facilitates or accelerates the removal reaction substantially at the site of the targeted material. Two necessary components of the invention are at least one compound that can form free radicals and at least one activator.

Selected objects of this invention are to provide a system wherein 1) higher polishing rates of conductors, insulators, barriers, and/or other surfaces are achieved from a combination of chemicals and abrasives than were otherwise achievable, 2) acceptable polishing rates of conductors, insulators, barriers, and/or other surfaces are achieved from a combination of chemicals and abrasives at lower concentrations than were achieved in the prior art; 3) provide a system where CMP can be performed at commercially acceptable removal rates with commercially acceptable uniformity in the polished product; 4) provide a system where CMP can be performed at commercially acceptable removal rates with commercially acceptable uniformity in the polished product and with substantially no metallic ion contamination of the substrate; 5) provide a system where CMP can be performed at commercially acceptable removal rates with commercially acceptable uniformity in the polished product, wherein the chemicals used are environmentally friendly, easily recoverable, or both; 6) provide a system of increasing the effectiveness of oxidizers and/or cleaners; 7) provide a method of recovering and re-using selected components of the system which are otherwise considered consumable components; and/or 8) provide a one-component system that exhibits usable shelf life for a period of at least 24 hours; and/or 9) provide an additive which increases the effectiveness of various commercial CMP slurries, beneficially without introducing additional compounds to the slurry fluid. These objects of the invention are not exhaustive, and it is realized that not all objects of the invention will be reached by any one system.

One embodiment of the CMP system of the invention comprises a fluid having at least one free radical-forming compound, and a pad which comprises at least one activator associated therewith.

Another embodiment of the CMP system of the invention comprises a fluid having at least one free radical-forming compound, and a plurality of particles which comprise at least one activator associated therewith.

Yet another embodiment of this invention comprises a material having at least one activator associated therewith and a fluid having at least one free radical-forming compound, where the material may not be incorporated in the pad or in particles which contact the substrate. Such a material may be for example an activator-containing material having the fluid flow therethrough immediately prior to for example polishing, and the activator in this instance may include an actinic component.

Yet another embodiment of this invention comprises a CMP fluid comprising a soluble activator, beneficially a non-metal-containing activator such as iodine, and a fluid having at least one free radical-forming compound.

In each of the above embodiments, the free radical-forming compound is beneficially an oxidizer. Preferred free radical-forming compounds include monopersulfate, di-persulfate, peracetic acid, urea hydrogen peroxide, hydrogen peroxide, acids thereof, salts thereof, adducts thereof, or mixtures thereof.

Yet another embodiment of this invention comprises a CMP fluid comprising a compound which produces free radicals that is not an oxidizer.

Yet another embodiment of this invention comprises a CMP fluid comprising a soluble activator, and a compound which produces free radicals that is not an oxidizer.

Yet another embodiment of this invention comprises a CMP fluid comprising a photoactivated solid activator, and a compound which produces free radicals that is not an oxidizer.

Yet another embodiment of this invention comprises a CMP fluid comprising free radicals produced by contacting the fluid with an activator.

Of course any or all of the above systems may be combined as efficiency and utility indicate. The system, i.e., pad, particles, and/or fluid as appropriate, may contain other components, including but not limited to: oxidizers other than the free radical-producing compound(s); other particulates and/or abrasives; free radical quenchers; stabilizers; promoters; soluble activators (preferably non-metal-containing activators); chelators; anticorrosion agents such as film formers; dispersability agents such as surfactants; pH adjustors such as acid or bases; viscosity control agents; and biocides. In some embodiments, free radicals formed in the CMP system of the current invention may be incompatible with certain compounds listed above. In this case, at least one of the Free Radical-Producing Compound, the activator, or the incompatible compounds should be admixed with the others at or near point-of-use.

The invention also encompasses the method of CMP of a substrate, for example a semiconductor substrate, a memory disk substrate, or any other surface wherein oxidative CMP is desired. The method includes the step of polishing or abrading the substrate while contacting the substrate with the fluid, wherein the fluid comprises free radicals, particularly oxygen-containing free radicals such as the superoxygen radical and/or the hydroxyl radical, generated as a result of the interaction of an activator with the at least one free radical-forming compound. In preferred embodiments, the fluid is a slurry containing particulates having activator(s) associated therewith. In preferred embodiments, the activator is not photoactive.

Yet another embodiment of the invention is recycling, recovering, and/or reusing the particulates or abrasives of this invention that have activator associated therewith from a post use slurry. Yet another aspect of this invention is particulate-containing CMP slurry systems described in the various embodiments thereof wherein the particulate-containing CMP slurry comprises recycled or recovered particulates having activator associated therewith.

A first principal embodiment of the invention is a composition for chemical-mechanical polishing a semiconductor or memory device substrate, comprising: a fluid comprising at least one compound that produces free radicals, wherein the at least one compound when contacted with at least one activator produces free radicals, and wherein and the fluid pH is between about 1 to about 11; and a plurality of particles having a surface and having at least one activator associated with the surface, wherein the at least one activator comprises a metal other than a metal of Group IV(B), Group V(B), or Group VI(B), and wherein the metal has multiple oxidation states, wherein the composition when used in a chemical mechanical polishing process will remove desired metal but will not create defects or nonuniformity such that the substrate can not undergo further fabrication to become a finished operable semiconductor or memory device.

A second principal embodiment of the invention is a composition for chemical-mechanical polishing a semiconductor or memory device substrate, comprising: a fluid comprising at least one compound that produces free radicals, wherein the fluid comprises less than about 500 ppm of dissolved metal ions having multiple oxidation states and the fluid pH is between about 1 to about 11, and wherein the at least one compound when contacted with at least one activator produces free radicals; and a plurality of particles having a surface in contact with the fluid and having at least one activator associated with the surface, wherein the activator associated with the surface is a dissociable salt of a metal and is present in an amount between 5 to 10000 ppm by weight of the composition, wherein the composition when used in a chemical mechanical polishing process will remove desired material but will not create defects or nonuniformity such that the substrate can not undergo further fabrication to become a finished operable semiconductor or memory device.

A third principal embodiment of the invention is a composition for chemical-mechanical polishing a semiconductor or memory device substrate, comprising: a fluid comprising at least one compound that produces free radicals, wherein the compound is an oxidizer that produces reactive oxygen-containing free radicals when contacted by an activator; and a plurality of particles having a surface and having at least one activator comprising an ion of at least one of iron, copper, manganese, cobalt, cerium, and nickel associated with the surface, wherein the activator(s) associated with the surface is/are present in a total amount ranging from about 5 ppm to about 30,000 ppm by weight in the composition, wherein the composition when used in a chemical mechanical polishing process will remove the desired material but will not create defects or nonuniformity such that the substrate can not undergo further fabrication to become a finished operable semiconductor or memory device.

The at least one compound in each of the first three principal embodiments can be a per compound present in the composition in an amount from about 0.01% to about 30% by weight. The per compound in one embodiment comprises a peroxide, a hydrohydrogen peroxide, or derivative thereof. The per compound in another embodiment comprises hydrogen peroxide and is present in the composition in an amount from about 0.01% to about 10% by weight. The per compound in yet another embodiment comprises at least one perfsulfate. The per compound in yet another embodiment comprises peracetic acid and is present in the composition in an amount from about 0.01% to about 10% by weight. The per compound in yet another embodiment comprises a peroxydisulfate, a peroxydiphosphate, or mixture thereof.

The at least one compound in each of the first three principal embodiments can comprises at least two of peracetic acid, a peroxide, a persulfate, a hydroxylamine, or mixture thereof, and the total amount present in the composition is from about 0.01% to about 30% by weight, and wherein the activator comprises cerium, iron, copper, or mixture thereof, and wherein the fluid contains less than about 100 ppm of dissolved metals having multiple oxidation states.

The at least one compound in each of the first three principal embodiments can be ozone. The at least one compound in each of the first three principal embodiments can comprise hydroxylamine, a hydroxylamine derivative, a salt thereof, or a combination thereof present in the composition in an amount from about 0.01% to about 30% by weight.

The composition of each of the first three principal embodiments can comprise an oxidizing agent selected from the group consisting of a metal salt, a metal complex, and a combination thereof.

The plurality of particles having a surface and having at least one activator associated with the surface in each of the first three principal embodiments can comprise a metal oxide abrasive. The metal oxide can in another embodiment comprise alumina, silica, ceria, or mixtures thereof, and the activator(s) associated with the surface is/are present in a total amount ranging from about 10 ppm to about 1,000 ppm by weight in the composition.

The plurality of particles having a surface and having at least one activator associated with the surface in each of the first three principal embodiments can comprise a substantially spherical ceramic particle having an average particle size from about 0.001 to about 1 micron and having a particle size distribution such that: at least about 95% by weight of the ceramic particles have a particle size within about 30% of the weight average particle size, wherein the ceramic particle comprises at least one metallic oxide selected from the group consisting of zinc oxide, bismuth oxide, cerium oxide, germanium oxide, silica, aluminum oxide; and a metallic sulfide, a metallic titanate, a metallic tantalate, a metallic zirconate, a metallic silicate, a metallic germanium oxide, a metallic niobate, a metallic borides, a metallic nitride, a metallic carbide, a metallic telluride, a metallic arsenide, a metallic silicide, metallic selenide, and mixtures or combinations thereof.

The plurality of particles having a surface and having at least one activator associated with the surface in each of the first three principal embodiments can comprise a alumina, optionally wherein the particles have a BET surface area between about 5 and 430 $m^2/g$ and the weight average particle size is less than about 0.4 microns, and additionally or alternatively, wherein the particles have an average particle size from about 0.001 to about 0.2 microns.

The plurality of particles having a surface and having at least one activator associated with the surface in each of the first three principal embodiments can comprise a silica, optionally wherein the particles have a BET surface area between about 5 and 1000 $m^2/g$, an average particle size less than about 1 micron, and a particle size distribution such that at least about 95% by weight of the silica particles have a particle size within about 30% of the weight average particle size, and additionally or alternatively, wherein the particles have an average particle size from about 0.002 to about 0.6 microns. The plurality of particles having a surface and having at least one activator associated with the surface in each of the first three principal embodiments can comprise fumed silica aggregates.

The plurality of particles having a surface and having at least one activator associated with the surface in each of the first three principal embodiments can comprise a ceria, or can comprise germania, spinel, titania, an oxide of tungsten, a nitride of tungsten, zirconia, an oxide of vanadium, or a combination thereof.

Finally, the plurality of particles having a surface and having at least one activator associated with the surface in each of the first three principal embodiments can comprise polymeric particles, which in one are a composite particle further comprising a metal oxide.

The composition of the first three principal embodiments can further comprise at least one second particle different from the plurality of particles having a surface and having at least one activator associated with the surface. This second particle may be the same or different than the first particle, and if the same, then the second particle has no activator associated with its surface. Additionally or alternatively, at least one compound of the first three principal embodiments can comprise a first oxidizer, and the compositions can optionally further comprise a second oxidizer.

The composition of the first three principal embodiments can further comprise at least one stabilizer in an amount sufficient to stabilize the composition. Additionally or alternatively, the composition of the first three principal embodiments can further comprise at least one promoter in an amount between 10 ppm and 5000 ppm. Additionally or alternatively, the composition of the first three principal embodiments can further comprise at least one chelator. Additionally or alternatively, the composition of the first three principal embodiments can further comprise at least one soluble activator, for example iodine. Additionally or alternatively, the composition of the first three principal embodiments can further comprise at least one anti-corrosion agent, at least one dispersability agent, or both. Additionally or alternatively, the composition of the first three principal embodiments can further comprise one pH adjustor, and wherein the fluid pH is between about 2 to about 8, for example between about 3 to about 7, and typically between about 3.5 to about 4.5. Additionally or alternatively, the composition of the first three principal embodiments can further comprise at least one polishing enhancement agent different from the at least one compound, for example glycol, glycine, a derivative of glycine, or mixture thereof.

The plurality of particles having a surface and having at least one activator associated with the surface of the first three principal embodiments can comprise a metal oxide particle comprising silica, alumina, ceria, or mixtures or combinations thereof, wherein the metal oxide particles a particle size distribution such that the one-sigma deviation is no more than about 20% of the average particle size, and wherein the activator comprises copper oxide, iron oxide, or mixture thereof.

The plurality of particles having a surface and having at least one activator associated with the surface of the first three principal embodiments can comprise a metal oxide, a polymer, or both, and wherein the activator associated with the surface comprises a dissociable cerium salt, dissociable copper salt, a dissociable iron salt, a dissociable manganese salt, a dissociable cobalt salt, a dissociable nickel salt, or mixture thereof.

The plurality of particles having a surface and having at least one activator associated with the surface of the first three principal embodiments can comprise a metal oxide that has been doped with a metal selected from iron, copper, manganese, cobalt, cerium, and nickel.

The plurality of particles having a surface and having at least one activator associated with the surface of the first three principal embodiments can comprise activator associated on from about 5 to about 80 percent of the connected outer surface, or alternatively or additionally about 25 to about 50 percent of the outer surface of the plurality of particles having a surface and having at least one activator associated with the surface.

The plurality of particles having a surface and having at least one activator associated with the surface of the first three principal embodiments can comprise activator associated on the surface of the plurality of particles at from about 0.01% to about 3% by weight of the plurality of particles.

Advantageously, in most every embodiment and especially in the composition of the first three principal embodiments, the composition will comprise less than about 10 ppm, for example less than about 2 ppm, of dissolved metal ions having multiple oxidation states.

The plurality of particles having a surface and having at least one activator associated with the surface of the first three principal embodiments can comprise silica, alumina, ceria, or mixtures thereof, and the activator associated on the surface of the particles comprises iron, wherein the amount of activator iron is from about 0.01% to about 3% by weight of the plurality of particles. Even in this embodiment, advantageously the fluid comprises less than about 10 ppm of dissolved iron.

The plurality of particles having a surface and having at least one activator associated with the surface of the first three principal embodiments can comprise silica, alumina, ceria, or mixtures thereof, and the activator associated on the surface of the particles comprises cerium, wherein the amount of activator cerium is from about 0.01% to about 3% by weight of the plurality of particles.

In a fourth principal embodiment, the invention includes a composition for chemical-mechanical polishing a semiconductor or memory disk substrate, comprising: a fluid comprising at least one compound that produces free radicals; and an activator in the fluid in an amount sufficient to for the desired free radical activity, wherein the activator when contacted with the at least one compound produces free radicals, and wherein the activator is not a promoter, such that the semiconductor or memory disk substrate is undamaged so the substrate can undergo further fabrication steps. The activator may comprise iodine when the compound that produces free radicals is a per compound, such as hydrogen peroxide. The activator may comprises cerium in an amount between about 10 ppm and about 1000 ppm. The activator may comprise a metal-glycine complex, wherein the metal consists essentially of cerium, iron, manganese, cobalt, or mixture thereof. Finally, the activator may comprise actinic radiation wherein at least one compound that produces free radicals comprises an alcohol and/or a ketone susceptible to forming free radicals when exposed to particular actinic radiation wavelengths.

In a fifth principal embodiment, the invention includes method of polishing a substrate surface having at least one feature thereon comprising a metal, which method comprises: providing the composition of any one of the first three principal embodiments of this invention; and chemically-mechanically polishing the feature by contacting the feature with the composition, wherein the polishing process will polish the metal feature but will not create defects or nonuniformity such that the substrate can not undergo further fabrication to become a finished operable product. Optionally, the plurality of abrasive particles having a surface in contact with the fluid and having at least one activator associated with the surface may comprise an abrasive present in the composition in an amount from about 0.01% to about 20% by weight, and the at least one compound that produces free radicals may comprise at least one oxidizer-that-produces-free-radicals which is present in the composition in an amount between about 0.01% to about 30%. In one embodiment, the substrate is a semiconductor, and the metal feature comprises aluminum, copper, titanium, tungsten, tantalum, any alloy thereof, any metal nitride thereof, any metal silicon alloy thereof, and any combination thereof. In semiconductors, it is not unusual for the feature to be adjacent to a material selected from the group consisting of tantalum, tantalum nitride, titanium, titanium nitride, titanium tungsten, tungsten, and any combination thereof, and wherein the metal feature material is different from the material adjacent to it. Advantageously, the method is sufficient to provide a chemically-mechanically polished substrate surface having a within-wafer nonuniformity from about zero to about 12 percent, and additionally or alternatively any microscratch thereon produced during the chemical-mechanical polishing is less than about 20 Angstroms in depth.

The substrate may alternatively be a memory device, where the metal feature comprises aluminum, copper, titanium, tungsten, tantalum, nickel, nickel-iron, or any alloy thereof, Sendust, and CZT and any combination thereof. Again, advantageously the method is sufficient to provide a chemically-mechanically polished memory device substrate surface wherein any microscratch thereon produced during the chemical-mechanical polishing is less than about 20 Angstroms in depth.

The substrate may alternatively be a silicon substrate, a gallium arsenide (GaAs) substrate, a thin film transistor-liquid crystal display glass substrate, or a Micro Electro Mechanical Systems structure, wherein said method is sufficient to provide a chemically-mechanically polished substrate surface wherein any microscratch thereon produced during the chemical-mechanical polishing is less than about 20 Angstroms in depth.

The key to the compositions and to the method is the particles having activator associated thereon. Advantageously, as the particles are not destroyed during polishing, advantageoulsy at least one portion of the particles in any of the compositions of this invention are recovered from used compositions after polishing and are re-used to polish another substrate surface. The plurality of particles may be recovered by filtration, centrifugation, or a combination thereof.

Finally, advantageously, wherein the polishing involves movably contacting the feature or the composition with a polishing pad, the polishing pad has a surface and may optionally comprise an activator associated with said polishing pad surface, wherein the activator is any of the activators in the first three principal embodiments of this invention.

These various components and embodiments will be discussed in greater detail below.

DETAILED DESCRIPTION OF THE INVENTION

This invention relates to a method of making selected oxidizers or other compounds become more effective. The system is adapted to polish substrates, and the invention includes methods of polishing the substrates. The system comprises a fluid containing a free radical-producing compound, usually an oxidizer. The system comprises an activator, which if metal containing is beneficially associated with a solid, and if none-metal-containing, may be included in the fluid. The system, i.e., pad, particles, and/or fluid as appropriate, may contain other components, including but not limited to: oxidizers other than the free radical-producing compound(s); other particulates and/or abrasives; free radical quenchers; stabilizers or passivators; promoters; soluble activators (preferably non-metal-containing activators); chelators; anticorrosion agents such as film formers; dispersability agents such as surfactants; pH adjustors such as acid or bases; viscosity control agents; and biocides, most of which will be discussed in detail below.

Substrate

The invention is useful for CMP of a substrate. The substrate can be a metal, a crystal, a semiconductor, an insulator, a ceramic, a glass, or other materials which may be improved by oxidative CMP. The invention can be used where very strong oxidizers or reactors are useful, and can be used in CMP of dual damascene substrates, silicides, and the like.

While the invention will be described in terms of semiconductor substrates, the system herein is also useful for chemical-mechanical polishing of other substrates. The substrates may be for example memory storage devices such as hard disks, floppy disks, magnetic heads, and/or formatted memory devices in a non-disk shape. The requirements of polishing these memory storage devices, including high removal rates, low-defect surface finish, selectivity, and cleanability are the same as for semiconductor processing, although there are some substrates that are encountered in memory device planarization that are not normally encountered in semiconductor processing, including for example nickel, nickel-iron alloys, Sendust, and CZT. The polishing on the device must remove the desired material but not create defects or nonuniformity such that the substrate can not undergo further fabrication to become a finished operable semiconductor or memory device.

The systems described herein are useful for CMP of these as well as for other substrates, which include both polishing on a small scale such as for semiconductors and also on a much larger scale including substantially any metallic device. The system herein is particularly useful for chemical-mechanical polishing of substrates where close tolerances are needed, for example telescopes, lenses, finely machined components including microscopic components, and the like. The invention is also useful for cleaning various macroscopic structures, especially where strong oxidizers and abrasives are desired to remove material or residue but where environmental contamination is a concern, for example cleaning of structural metal and the like.

CMP is used in a variety of semiconductor processes to polish wafers having a variety of surface features, such as oxide and/or metal layers. By way of example, often the surface of a semiconductor wafer has exposed insulative structures, exposed conductor structures, exposed barrier structures which may reside between conductor and insulative structures, and often "stop" structures which are designed to stop material removal at a preselected level. The composition or slurry of this invention may be used to polish at least one feature or layer on a substrate such as a silicon substrate, a gallium arsenide (GaAs) substrate, a thin film transistor-liquid crystal display ("TFT-LCD") glass substrate, or any other substrate associated with integrated circuits, thin films, semiconductors, Micro Electro Mechanical Systems (MEMS) structures, memory storage devices, and the like. By way of example, the composition of the present invention may be used in the CMP of a substrate having one or more layers of aluminum, copper, copper-aluminum alloy, tantalum, titanium, tungsten, or tantalum-, titanium-, or tungsten-containing alloys, such as tantalum nitride, titanium nitride, titanium tungsten, or other combinations thereof.

The conductor structures are typically one or more layers of metals, and/or metal alloys such as tungsten-titanium and aluminum-copper, and/or metallic compounds such as AlSi or metal nitrides such as TiN. As used herein, unless otherwise stated, when referring to the substrate the term "metals" includes metals, alloys of metals, and also metallic compounds, alone or in combination. Typical metals used include aluminum, copper, titanium, tantalum, tungsten, gold, silver, platinum, ruthenium, as well as alloys thereof and/or of metallic compounds such as nitrides thereof.

The barrier structures may be metals of a different composition from the conductor structures, though one of ordinary skill in the art is aware of certain combinations that are more useful than others.

Typical insulative structures include dielectrics such as silica, alumina, organic silicas, polysilicon, gallium arsenide, and others known in the art. Spun glass, polysilicon, organic glass, and other embodiments are also included.

Stop structures are generally any of the above, though one of ordinary skill in the art is aware, certain combinations are more useful for certain chemistries than others.

Because one object of this invention is to promote formation of one of the stronger oxidizers known to be compatible with fluids, the invention is useful on substantially all metals, including some "noble" metals.

Fluid Comprising an Oxidizer

The CMP system of the current invention requires a fluid comprising an oxidizer for chemical etching of material. The oxidizing agent of the CMP composition is in a fluid composition which contacts the substrate, and assists in the chemical removal of targeted material on the substrate surface. The oxidizing agent component is thus believed to enhance or increase the material removal rate of the composition. Preferably, the amount of oxidizing agent in the composition is sufficient to assist the chemical removal process, while being as low as possible to minimize handling, environmental, or similar or related issues, such as cost. The various amounts of oxidizing agent provided in Table 1 are all effective and suitable, while the more preferred amount of oxidizing agents is from about 0.01 to about 6 weight percent relative to the composition, for example between about 0.1% and about 3% of oxidizer.

Advantageously, in one embodiment of this invention, the oxidizer is a component which will, upon exposure to at least one activator, produce free radicals giving an increased etching rate on at least selected structures. The free radicals described infra will oxidize most metals, and will make the surface more susceptible to oxidation from other oxidizers. However, oxidizers are listed separately from the "Compound Producing Free Radicals", to be discussed infra, because some oxidizers do not readily form free radicals when exposed to the activators, and in some embodiments it is advantageous to have one or more oxidizers which provide matched etching or preferential etching rates on a variety of combinations of metals which may be found on a substrate.

As is known in the art, some oxidizers are better suited for certain components than for other components. In some embodiments of this invention, the selectivity of the CMP system to one metal as opposed to another metal is maximized, as is known in the art. However, in certain embodiments of this invention, the combination of oxidizers is selected to provide substantially similar CMP rates (as opposed to simple etching rates) for a conductor and a barrier combination, so that in many cases acceptable planarization is achieved by a single CMP formulation.

The oxidizing agent is in one embodiment an inorganic or organic per-compound. A per-compound is generally defined as a compound containing an element in its highest state of oxidation, such as perchloric acid; or a compound containing at least one peroxy group (—O—O—), such as peracetic acid and perchromic acid.

Suitable per-compounds containing at least one peroxy group include, but are not limited to, peracetic acid or salt thereof, a percarbonate, and an organic peroxide, such as benzoyl peroxide, urea hydrogen peroxide, and/or di-t-butyl peroxide.

Suitable per-compounds containing at least one peroxy group include peroxides. As used herein, the term "peroxides" encompasses R—O—O—R', where R and R' are each independently H, a $C_1$ to $C_6$ straight or branched alkyl, alkanol, carboxyl acid, ketone (for example), or amine, and each of the above can independently be substituted with one or more benzyl group (for example benzoyl peroxide) which may themselves be substituted with OH or C1–C5 alkyls, and salts and adducts thereof. This term therefore includes common examples such as hydrogen peroxide, hydrohydrogen peroxide, peroxyformic acid, peracetic acid, propaneperoxoic acid, substituted or unsubstituted butaneperoxoic acid, hydroperoxy-acetaldehyde, Also encompassed in this term are common complexes of peroxides, for example urea peroxide.

Suitable per-compounds containing at least one peroxy group include persulfates. As used herein, the term "persulfates" encompasses monopersulfates, di-persulfates, and acids and salts and adducts thereof. Included for example is peroxydisulfates, peroxymonosulfuric acid and/or peroxymonosulfates, Caro's acid, including for example a salt such as potassium peroxymonosulfate, but preferably a non-metallic salt such as ammonium peroxymonosulfate.

Suitable per-compounds containing at least one peroxy group include perphosphates, defined as above and including peroxydiphosphates.

Also, ozone is a suitable oxidizing agent either alone or in combination with one or more other suitable oxidizing agents.

Suitable per-compounds that do not contain a peroxy group include, but are not limited to, periodic acid and/or any periodiate salt (hereafter "periodates"), perchloric acid and/or any perchlorate salt (hereafter "perchlorates") perbromic acid and/or any perbromate salt (hereafter "perbromates"), and perboric acid and/or any perborate salt (hereafter "perbromates").

Other oxidizing agents are also suitable components of the composition of the present invention. Iodates are useful oxidizers and can be present in an amount ranging from about 0.01% to about 30%.

An organic and/or inorganic hydroxylamine compound or salt are also useful oxidizers and can be present in an amount ranging from about 0.01% to about 30%, but is preferably present in an amount ranging from about 0.5% to about 15%. Hydroxylamine compounds, including salts and adducts thereof, can be used as a polishing enhancer at low concentrations. As used herein, the term "hydroxlyamine compound" satisfies the general formula X, Y>N—O—Z, that is, an X and Y are each bonded to the nitrogen and the Z is bonded to the oxygen, wherein the moieties X, Y, and Z are independently hydrogen, hydroxyl group, a substituted C1–C6 straight, branched or cyclo alkyl, alkenyl, or alkynyl group, a substituted acyl group, straight or branched alkoxy group, amidyl group, carboxyl group, alkoxyalkyl group, alkylamino group, alkylsulfonyl group, or sulfonic acid group, or salts or derivatives thereof, or wherein X and Y are linked together form a nitrogen-containing heterocyclic $C_4$–$C_7$ ring. Examples of hydroxylamine compounds according to the invention include, but are in no way limited to, hydroxylamine, N-methyl-hydroxylamine, N,N-dimethyl-hydroxylamine, N-ethyl-hydroxylamine, N,N-diethyl-hydroxylamine, methoxylamine, ethoxylamine, N-methyl-methoxylamine, and the like. It should be understood that hydroxylamine compounds, as defined above, are available (and may be included in a composition according to the invention) as salts, e.g., sulfate salts, nitrate salts, formate salts, or the like, or a combination thereof, and the term includes these forms of hydroxylamine compounds and their derivatives. Therefore the term encompasses hydroxylamine, a sulfate or nitrate salt of hydroxylamine, or a combination thereof.

Any of these oxidizers can be present in an amount ranging from about 0.01% to about 30%, for example 0.01% to 10%, but is preferably present in an amount ranging from about 0.5% to about 15%. As used herein, weight percent is given as weight percent of the fluid or slurry. These oxidizers are preferably present in an amount ranging from about 0.5% to about 15%.

The oxidizing agent may be a salt of a metal having multiple oxidation states, a complex or coordination compound of a metal having multiple oxidation states, or any combination thereof, provided the compound has a sufficient oxidative potential to oxidize the substrate. Metal-containing oxidizer salts that are useful oxidizers for the selected substrates can be present in an amount ranging from about 0.001% to about 12%, for example in an amount ranging from about 0.1% to about 4%. One embodiment has, in addition to a per-containing oxidizer that produces free radicals, between about 0.001% to about 0.5%, for example from about 0.005% to about 0.05%, of soluble cerium salts. Another embodiment has, in addition to a per-containing oxidizer that produces free radicals, between about 0.001% to about 0.5%, for example from about 0.005% to about 0.05%, of soluble iron or other promoter salts, discussed below.

In general, the metal-containing oxidizers are less preferred. Examples include permanganate, perchromate, iron salts, aluminum salts, cerium salts, and the like. When admixed with another common oxidizer such as hydrogen peroxide in a solution, many of the metal-containing oxidizers, for example ferric nitrate, react with the hydrogen peroxide, producing safety issues and also repeatability issues as the oxidizing capacity of the mixture declines rapidly with time. The nature of the reaction is not known, although it is known that if the pH is above about 5, iron precipitates as $Fe(OH)_3$ which catalytically decomposes hydrogen peroxide to oxygen and water. Such an event is highly undesirable, as oxygen buildup in confined systems and in pumps can result in dangerous situations.

Metal-containing oxidizers in excess in solution can also quench free radical. For example, the reaction of hydroxyl radical and ferrous iron is: $—OH+Fe^{2+}=>FeOH^{2+}$.

Another problem with metal-containing oxidizer salts is that they can leave metal contamination on the substrate. This metallic contamination can result in shorts and unwanted conductive properties, along with other problems. Certain metals, such as those with a tendency to plate on or be absorbed on to at least one part of the substrate, are more damaging than other metals. Another problem with many metal compounds is they react with and cause degradation of the oxidizer.

Generally, a mixture of two or more oxidizers provides at selected concentrations a synergystic effect. In general, the various oxidizing agents described herein, as well as salts and adducts thereof, may be used either alone or in combination with one another, although any combination that might undesirably complicate the CMP process is preferably avoided.

Most preferably, the oxidizing agent is a percompound or a compound possessing a reactive peroxy functional group, such as persulfates, peracetic acid, peroxides, particularly urea hydrogen peroxide and/or hydrogen peroxide, peroxydiphosphates, as well as any acid, salt, or adduct of the preceding, and any combination of the preceding.

In one embodiment, the most preferred oxidizing agents for use in the slurry according to the invention are hydrogen peroxide, ammonium persulfate, and/or potassium persulfate.

In another embodiment, particularly preferred oxidizers are hydrogen peroxide, urea hydrogen peroxide, persulfates such as ammonium persulfate, or mixture thereof. Because urea hydrogen peroxide is 34.5 wt % hydrogen peroxide and 65.5 wt % urea, a greater amount by weight of "urea hydrogen peroxide" must be included in the CMP slurry to achieve the desired oxidizer loading, as the loading is expressed as the peroxide component.

Oxidizer-Based Free Radical-Producing Compound

The invention requires a free radical-producing compound which will, upon exposure to at least one activator, produce free radicals capable of giving an increased etching rate on at least selected structures of the substrate. A free radical is a chemical component that contains a free electron which covalently bonds with a free electron on another molecule or atom. Free radicals are also generally described as molecular fragments having one or more unpaired electrons. Free radicals are usually both shortlived and also are highly reactive. In spite of their transitory existence, free radicals can initiate many chemical reactions.

The free radical-producing compound and the formed free radicals are in a fluid, usually a solution, that contacts the substrate during CMP. While some free radical-producing compounds may naturally create free radicals in a small amount, the amount of naturally-formed free radicals is small, and the amount can be increased significantly in the presence of an activator. As used herein, the term free radical-producing compound means a compound which will, upon exposure to at least one activator, be capable of producing a free radical. Free radicals can not be readily measured. The presence of the free radical can be inferred if the system is capable of giving a significantly increased etching rate on metal, for example tungsten, structures of the substrate. By a significant amount, it is meant that the etching rate during the CMP increases at least 10%, preferably by at least 20%, more preferably at least 30%, when the activator is present and contacting the fluid containing the substrate as compared to when the activator is absent, wherein the other conditions are identical.

All transition metals, with the exception of copper, contain one electron in their outermost shell and can be considered "free radicals." As used herein, the term "free radical" does not encompass ions of transition metals.

In a preferred embodiment the free radical is a reactive oxygen radical. Any free radical involving oxygen can be referred to as reactive oxygen radical. Oxygen-containing free radicals generally are depicted as containing two unpaired electrons in the outer shell. When free radicals steal an electron from a surrounding compound or molecule to pair up the unpaired electrons, a new free radical is often formed in its place. In turn the newly formed radical then looks to return to its ground state by stealing electrons. Thus the chain reaction continues and can be thousand of events long, provided the solution in which the free radical propagates does not have free radical quenchers or reactants upon which the free radicals can expend themselves on.

The oxygen-containing hydroxyl radical is one of the most reactive chemical species known, second only to elemental fluorine in its reactivity. This is a preferred free radical. The oxygen singlet is another preferred free radical. Both are much stronger reactants than, for example, hydrogen peroxide, but both can be formed from hydrogen peroxide. Compared to chlorine, the relative oxidation potential of various oxidants are:

| | |
|---|---|
| Fluorine | 2.23 |
| Hydroxyl radical | 2.06 (Free Radical) |
| Atomic oxygen (singlet) | 1.78 (Free Radical) |
| Hydrogen peroxide | 1.31 |
| Permanganate | 1.24 |
| Chlorine | 1.00 |
| Iodine | 0.54 |

In a preferred embodiment the system has a fluid that contacts the substrate during the CMP process, and this fluid comprises a free radical-producing compound and the free radicals. More preferably, the free radical-producing compound is an oxidizer and the free radical is a reactive oxygen radical, for example a hydroxyl radical. Alternately or additionally, a preferred embodiment of the system of the invention has a fluid that contacts the substrate during the CMP process, and this fluid comprises a free radical-producing compound, the free radicals, and an oxidizer. In such an embodiment, the free radical-producing compound is beneficially a first oxidizer, the free radical is a reactive oxygen radical, for example a hydroxyl radical, and fluid further comprises a second oxidizer.

The free radicals, particularly the hydroxyl radical formed by for example the Fenton-type conversion of hydrogen peroxide, are believed to greatly accelerate the etching rate of metal substrates. Without being bound by theory, the hydroxyl radicals are believed to be very powerful due to the high oxidation potential. Further, the initiation of oxidation onto the substrate structure is believed to make the structure more susceptible to further oxidation, for example from the oxidizer(s) in the fluid.

The high oxidation potential of the hydroxyl radical relative is shown below, along with the oxidation potential of other compounds. The conversion of $Fe^{+3}$ and an electron to give $Fe^{+2}$ has a standard reduction potential of 0.77 volts. Typical standard reduction potentials for compounds found in CMP slurries are as follows:

| | | | |
|---|---|---|---|
| Hydroxyl radical | | | about 2.8 volts |
| $S_2O_8^{-2}$ | to | $2SO_4^{-2}$ | 2.0 volts (persulfate) |
| $H_2O_2 + 2H^+$ | to | $2H_2O$ | 1.78 volts (hydrogen peroxide) |
| $Ce^{+4}$ | to | $Ce^{+3}$ | 1.44 volts (cerium salt) |
| $O_3^{-3}$ + water | to | $O_2 + 2OH^-$ | 1.24 volts (ozone) |
| $Ag^+$ | to | $Ag^{+0}$ | 0.80 volts |
| $Fe^{+3}$ | to | $Fe^{+2}$ | 0.77 volts |
| $Fe(CN)_6^{-3}$ | to | $Fe(CN)_6^{-4}$ | 0.46–0.69 volts |
| $I_2$ | to | $2\ I^-$ | 0.54 volts |
| $Ni^{+2}$ | to | $Ni^{+0}$ | −0.23 volts |
| $Cu^{+2}$ | to | $Cu^+$ | 0.16 volts |
| $Zn^{+2}$ | to | $Zn^{+0}$ | −0.76 volts |

The hydroxyl free radical is therefore a much stronger oxidizing agent than an oxidizer such as hydrogen peroxide or ferric nitrate. The free radical is formed when needed and does not pose a safety issue. Fluorine, the only component with a similar oxidation potential, is not used in CMP slurries due to safety concerns.

Generally, free radicals such as the hydroxyl radical will react with any component. If numerous additives are in a fluid, the hydroxyl radical will be reacting with these additives to form other products and/or other radicals which may not be able to function effectively on the substrate. In some embodiments, the amount of additives is less than 2% total, for example less than 1% total, and in some embodiments less than 0.2% total, based on the weight of the fluid.

Selected oxidizers, for example peroxides, peroxydiphosphates, persulfates, and combinations of the foregoing, are known to produce a small amount of free radicals naturally (wherein the term "naturally" may be the result of small amounts of activator that are found in almost every solution), but the amount of free radical production increases substantially when contacted by an initiator. Ozone also produces free radicals but the amount of free radical production can increase substantially when contacted by an appropriate activator. Each of these compounds will, upon exposure to at least one activator, produce significantly increased concentrations of free radicals capable of giving an increased etching rate on at least selected structures of the substrate. Not all activators will act with all compounds In one embodiment the preferred free radical-producing compounds in the fluid comprise peroxide compounds, persulfates compounds, peroxydiphosphate compounds, or a mixture thereof. In another embodiment the preferred free radical-producing compounds in the fluid comprise peroxide compounds, persulfates compounds, peroxydiphosphate compounds, ozone, or a mixture thereof. These preferred free radical-producing compounds also are excellent oxidizers, and for these cases the single component can act as an oxidizer and as a free radical producer.

In one embodiment the preferred free radical-producing compounds are persulfates, for example ammonium persulfate. These compounds also are excellent oxidizers. In one embodiment one or more are present in a total amount ranging from about 0.1% to about 25%, preferably from about 0.5% to about 12%.

The free radical producing compound can be hydroxylamine. These compounds also are excellent oxidizers. In one embodiment one or more are present in a total amount ranging from about 0.1% to about 25%, preferably from about 0.5% to about 12%.

In one embodiment the preferred free radical-producing compounds are peroxydiphosphates, for example ammonium peroxydiphosphate. In one embodiment one or more are present in a total amount ranging from about 0.1% to about 25%, preferably from about 0.5% to about 12%.

The most preferred free radical-producing compounds are peroxide compounds. In one embodiment the most preferred free radical-producing compounds are peroxide compounds, for example hydrogen peroxide, urea peroxide, hydrohydrogen peroxide, or substituted peroxides such as t-butyl peroxide (CAS # 110-05-9) or t-butyl hydroperoxide (CAS # 75-91-2), or mixtures thereof, most preferably hydrogen peroxide. In another embodiment one or more are present in a total amount ranging from about 0.1% to about 20%, preferably from about 0.5% to about 10%. In one embodiment, hydrogen peroxide is the sole free radical-producing compound and is also the sole oxidizer in the fluid, and the hydrogen peroxide is present in an amount ranging from about 1% to about 10%, for example from about 3% to about 7%, typically about 5%.

In one embodiment the preferred free radical-producing compound is ozone, which is also an excellent oxidizer. Ozone can be produced in the fluid or can be produced away from the fluid and then dissolved into the fluid.

In one embodiment the preferred free radical-producing compounds include peroxydisulfates, for example ammonium peroxydisulfate. In one embodiment one or more are present in a total amount ranging from about 0.015 to about 30%, for example from about 0.1% to about 25%, preferably from about 0.5% to about 12%.

Of course, not all oxidizers form a sufficient amount of free radicals when exposed to one particular activator. Also, not all oxidizers form a sufficient amount of free radicals when exposed to any activator.

In some embodiments of the invention, the fluid composition contacting the substrate will contain one or more oxidizers which when contacted by the activator are free radical-producing compounds, and one or more oxidizers which when contacted by the activator do not create a significant amount of free radicals. This allows one method to have the oxidizing capacity of the solution be at least partially independent of the amount of the one or more free radical-producing compounds. The process can therefore be optimized for the requirements of the user through the choice of formulas for rapid bulk metal removal with moderate to high selectivity to the common barrier materials; and/or a CMP polish which may extend through the barrier which may be similarly optimized through the choice of material and process conditions to yield the desired selectivity, either 1:1:1 or with a harder stop on for example TEOS. In these embodiments, depending on the users' preferences, the entire CMP process might also be accomplished with a single slurry and simple programming of the polishing tool.

In general, the amount of oxidizer-based free radical-producing compounds in the fluid ranges from about 0.01% to about 25%, more typically from 0.1% to 15%. The amount of free radical-producing compounds in the fluid can be near the lower range when there are other oxidizers present, or where oxidation is a minor part of the polishing. When the amount of activator is high, for example the activator is present in an amount ranging from 50 ppm to about 3000 ppm in the slurry, or is present in an amount covering at least about 2% of the pad, the amount of free radical-producing compounds is often limited to below about 10% to control the reaction rate.

Non-Oxidizer Based Compounds That Produce Free Radicals

Other compounds other than oxidizers may form free radicals when contacted by the activator, and the compound may not necessarily be a reactive oxygen radical. Sulfur-containing free radicals are also known. Descriptions of redox systems involving activators that generate free radicals in the presence of oxidizing agents are provided in Walling, C., Free Radicals in Solution (1957), pp. 564–579, and Bacon, R, The Initiation of Polymerisation Processes by Redox Catalysts, Quart. Revs., Vol. IX (1955), pp.287–310, the entire contents of which are incorporated herein by this reference.

Organic-based compounds that produce free radicals are known. Free radicals can be produced by for example irradiating an R—OH, for example an alcohol, alkanolamine, aminoalcohol, and the like, where the only activator is actinic radiation, generally with a wavelength below about 220 nanometers, for example about 185 nanometers. Methanol in water can be irradiated to give OH*, $CH_3$*, and other radicals.

Free radicals can also be produced in alcohols through an activator, for example a ketone. Actinic radiation is again required, but the energy of the light can be lower. For example, a ketone, say benzophenone or acetophenone, can be irradiated with actinic radiation, generally with a wavelength below about 370 nanometers, for example between about 300 and 350 nanometers. This forms a long-lived intermediate radical activator, wherein the half life can be on the order of a tenth of a second. The intermediate then reacts to form a radical with an R—OH to form free radicals. One advantage of this system is the activator can be for example on the moving pad and be activated immediately before, i.e., upstream, of the substrate. Free radicals would then be formed as the pad encountered the substrate.

In general, the amount of non-oxidizer free radical-producing compounds in the fluid ranges from about 0.01% to about 30%, more typically from 0.1% to 15%. The amount of free radical-producing compounds in the fluid can be near the lower range when there are other oxidizers present, or where oxidation is a minor part of the polishing. When the amount of activator is high, for example the activator is present in an amount ranging from 50 ppm to about 3000 ppm in the slurry, or is present in an amount covering at least about 2% of the pad, the amount of free radical-producing compounds is often limited to below about 10% to control the reaction rate.

Activator

The activator is a material that facilitates the formation of free radicals by at least one free radical-producing compounds present in the fluid. If the activator is a metal ion, or metal-containing compound, it is in a thin layer associated with a surface of a solid which contacts the fluid. If the activator is a non-metal-containing substance, it can be dissolved in the fluid. It is preferred that the activator is present in amount that is sufficient to promote the desired reaction.

Generally, light-activated activators such as titanium oxides (and light used as an activator) are not preferred. There is no method to get light at the desired concentration between a pad and a substrate. The activator must therefore be pre-activated, and/or the free radicals must be formed, before the fluid passes between a pad and a substrate.

In some configurations use of photo-activated activator is acceptable. For example, for long-lived free radicals, i.e., with an average life in solution of a tenth of a second or more, the photoactivator can be a matrix containing activator that the fluid must contact just before passing between a pad and a substrate. A bed of activator can for example be placed immediately upstream of the fluid outlet, so that free radicals formed have not totally degraded before passing between the pad and the substrate. The photoactivated materials of U.S. Pat. No. 6,362,104, the disclosure of which is incorporated by reference, can be used in this capacity. These include $TiO_2$ and $Ti_2O_3$, as well as to the less preferred oxides of Ta, W, V, and Nb.

The activator may be a non-metal-containing compound. Iodine is a useful with for example hydrogen peroxide to form free radicals. The iodine may be present in an amount sufficient to create the desired free radical activity. In some embodiments, the iodine may be present in an amount ranging from about 1 ppm to about 5000 ppm, preferably between about 10 ppm and about 1000 ppm. Non-metallic activators are often synergistically combined with metal-containing activators.

The activator can also be a metal-containing compound, in particular a metal selected from the group consisting of the metals known to activate a Fenton's Reaction process in hydrogen peroxide. Advantageously, most metal-containing activators are associated with a solid as discussed below. Of course, the system of this invention may optionally comprises both metal-containing activators and non-metal-containing activators, where the non-metal-containing activators are in solution in the fluid and where at least a portion of the metal-containing activators are associated with a solid.

In another embodiment, the activator is any metal-containing compound known to be useful in Fenton's reactions as an activator, wherein the oxidizer is a peroxide, particularly hydrogen peroxide. Transition metals like copper, manganese, cobalt, and cerium, as well as the more traditional iron and copper, are able to catalyze this reaction. However, these metals having multiple oxidation states, particularly iron and copper, are known to be particularly problematic if in solution with for example hydrogen peroxide or persulfates. Further, cobalt, manganese, and cerium in solution have environmental concerns. All are a contaminant to the substrate. Finally, all, if in solution, are believed to act as promoters rather than activators. We have found, however, that if these elements or molecules are associated with a solid contacting the fluid, they can function as activators.

In one important embodiment, the activator comprises a metal-containing compound having the metal other than a metal of Group 4(b), Group 5(b) or Group 6(b) of the Periodic Table of Elements. In one embodiment, compounds of metals of Group 1(b) or Group 8 are preferred metal-containing activators. However, the cost of, and the potential of substrate contamination from these metals varies greatly. See, for example, Handbook of Chemistry and Physics, 64th Edition Periodic Table of the Elements, Inside Front Cover, which is fully incorporated herein by reference.

In another important embodiment, the activator comprises a dissociable salt of a metal. As used herein, the phrase "dissociable salt of a metal" should be understood to mean that metal portion of the compound can form a metal ion and remain associated with a surface while counterions can be released into solution.

In another important embodiment, the activator comprises any transition metal-containing compound that can react with a compound that produces free radicals, is associated with a solid. That is, the activators of the current invention are not soluble in the fluid. Activators can be associated with a particle. The particle may be an abrasive, or it may be a carrier for the activator. Activators can be associated with a pad. Activators can be held in a matrix such that the fluid containing the compounds that form free radicals contacts the activator immediately before contacting the substrate.

Preferably, the activator can function effectively without actinic radiation, and the oxidizer itself can rejuvenate the activator. This step in some very preferred embodiments will also result in the formation of a second free radical, though often a weaker free radical than was produced in the first step. For example, without being bound to theory, as opposed to the classical Fenton's reaction which is the oxidation of Fe(II) by hydrogen peroxide, the reaction of the surface bound Fe activator of this system by hydrogen peroxide forms both superoxide anion and hydroxyl radicals. Therefore, hydrogen peroxide is both an oxidant and reductant in these systems.

If an activator is itself made effective with light, the "effectiveness" of the activator will decay when it is not exposed to light. It is very difficult to get light between a pad and a substrate, and therefore concentration gradients will occur.

Generally, the preferred activators are iron, copper, cerium, nickel, manganese, and/or cobalt. They can be used in any combination. The more preferred activators are iron or cerium salts.

It is advantageous that the activator be associated with a surface, as opposed to being for example a solid crystal. The activator can be a homogeneous composition of the active activator. The homogenous activator are preferably small particles with high surface areas. This form of activator should have a mean particle diameter less than about 1 micron, preferably less than 0.4 microns, more preferably less than 0.1 microns, and a surface area greater that about 10 $m^2/g$. The same preferred particle characteristics will also optimize the colloidal stability of the activator in the polishing compositions.

Solid crystals of activator-type material often do not have sufficient binding capacity/flexibility in the binding of the atoms to allow the activator components to change oxidation states to react with the compound that produces free radicals. Interaction of crystals may result in crystal dissolution, as the metal leaves the crystal and enters the solution. For this reason solid activator material is generally discouraged, though if metal loss is insignificant solid activator particles can be contemplated.

The metal-containing activator compounds associated with a particle or a pad may be in a variety of forms, such as an oxide, a nitrate, a halide, a perchlorate, or an acetate of the metal. The counter-ions are generally of lesser significance, unless they stabilize the activator by hindering access to the compounds that form free radicals. In one embodiment, the activator associated with a particle and/or polishing pad is a metal-containing acetate, such as copper acetate ("CuAc") or iron acetate ("FeAc") or cerium acetate ("CeAc"). The metal-containing activator compounds may be a source of ions associated with a solid and not dissolved in the fluid containing the oxidizer.

Activator oxides can often be used but are not preferred. By way of example, suitable metal oxides include some iron oxides, copper oxide, and cobalt oxide. Some, for example cerium oxide and aluminum oxide may not be able to function as an activator, even if coated on an abrasive. Further, the activators of the current invention are not for example titanium oxides which require actinic energy to be effective.

The activators of the current invention can include iron and copper oxides at very low amounts. Many forms of iron oxide are not activators but rather catalyze decomposition of preferred oxidizers such as hydrogen peroxide without forming the beneficial free radicals. While iron is a greatly preferred activator, there are conditions under which it will form an oxide/hydroxide that can catalytically cause decomposition of hydrogen peroxide and ammonium persulfate without forming free radicals, and resulting in dangerous conditions as oxygen levels increase. Certain crystals, for example certain forms of iron oxide and hydroxide, do not activate compounds that form free radicals, for example hydrogen peroxide.

However, several iron and copper oxides form superoxide anions and hydroxyl radicals, but may be rate limited by the oxidation of surface bound iron by hydrogen peroxide. Three iron oxides: ferrihydrite, goethite, and semi-crystalline iron oxide, are somewhat active in activating hydrogen peroxide, but activator disposed as a layer on a surface of a metal oxide particle has much superior kinetics.

The activator is preferably chemically or physically associated with the surface of a particle as molecular species, as a small particle or as a monolayer. For example, a doped Ceria-gamma Alumina Supported Nickel is a useful activator for some compounds that form free radicals. The activator activity of an alumina supported copper oxide, compared to that of goethite, has shown that the supported copper oxide was approximately ten times more active than goethite. For traditional Fenton's reactions, Fe containing zeolite when compared with the behavior of homogeneous Fe activators at the same experimental conditions found the heterogeneous activators have a higher reactivity and a reduced dependence on the pH of the solution. However, under some conditions they can also have a higher rate of the side reaction of hydrogen peroxide decomposition to water and oxygen.

The abrasive can be a co-formed abrasive in which the activator is homogeneously mixed with another oxide to form solid particles containing an intimate mixture of the activator supported on metal oxide. In addition the activator can be chemically or physically adsorbed on the surface of the abrasive as molecular species, small particles or as a monolayer.

We have found that transition metal-activators that are associated with solids, for example an abrasive, a particle, or a pad, can initiate the creation of free radicals without the undesirable side effects such transition metals may have if they are in solution in the fluid contacting the substrate. In particular, we have surprisingly found that transition metal-containing activators associated with the surface of a solid are effective as activators, promoting the formation of free radicals, but these transition metal-containing activators are not "in solution" and therefore do not significantly oxidize or contaminate the substrate. Further, we have surprisingly found that the metal-containing activators so associated with the surface of the solid do not cause significant degradation of the hydrogen peroxide or of the oxide when admixed for a period of at least several hours, often a day or more, which is a typical storage time in semiconductor fabrication plants.

The activator can be associated with a polymeric particle or polishing pad. In a preferred embodiment of the invention, the polishing pad has at least one of Fe, Cu, or Ce salts associated with the surface thereof, and/or at least one of Fe and Cu oxides associated with the surface thereof. As pads are worn during use, having activators within the pad matrix that will eventually be contacting a fluid containing the compound that produces free radicals is advantageous. Generally, a monolayer of activator atoms associated with the surface of the pad that contacts the fluid and promotes free radical formation where the free radicals can contact the substrate will provide maximum activity. However, as polymeric pad may wear, having between 0.1 and 20% activator within a polymer pad is acceptable.

In most embodiments of the invention, however, the transition-metal-containing-activator is associated with an abrasive particle.

The amount of activator in a slurry can be low. Of course, activator associated with particles in a slurry can be present in any activating amount, say from about 0.0005% to about 10% by weight activator. High concentrations are usually wasteful, however. In a system with transition metal containing activator, i.e., a slurry having a transition metal activator coated on solid particles contained within the slurry, excellent free radical activity is observed if the amount of activator in the slurry is about 5 to 10000 ppm total activator. If the activator is located on particles such that access to fluid is not impaired, a slurry can have between 5 and about 4000 ppm, for example between about 10 and 1000 ppm. In preferred low-activator-content slurries tested, activator concentrations of between about 5 and about 200 ppm, for example between about 20 and about 100 ppm, say about 30 ppm, of activator expressed as a weight percent of the slurry, provided accelerated etch rates compared to formulations without activator.

Compounds or salts that might otherwise be considered an activator are not included if they do not function as an activator. As used herein, therefore, a transition metal is an activator only if it is associated with a solid. For example, activator within a particle matrix where it can not generate free radicals that can escape the particle structure is not included in the term activator. Activator elements or compounds that can not activate the formation of free radicals, for example because it is incorporated within a matrix where changes between oxidation states is discouraged, is not included as activator. Compounds that can plate out or contaminate the substrate are viewed as contaminants. Finally, activator that is chelated or otherwise not available for reaction with the compound that produces free radicals is not included as activator.

In one important embodiment of the invention, at least a portion of the activator is associated with at least a portion of the abrasive particles. In its most general meaning, the term "associated" means that activator compounds are affixed to the surface of an abrasive particle, such that the activator contacts the fluid containing the Free Radical-Producing Compound, wherein the contacting results in significant increase in free radical formation (as determined by significant increase in CMP removal rates discussed previously). Generally, having the activator be associated with the abrasive means the activator is coated on the abrasive, absorbed onto the abrasive, or is adsorbed on to the abrasive, or is otherwise attached or bound to the abrasive. The activator coating can be in a pure form, or the activator can be admixed with other compounds, minerals, metals, and the like, to form an activator composition that is coated onto at least a portion of an abrasive.

In preferred embodiments very little, preferably none, of the activator breaks the association with the abrasive and enters the solution as an ion or soluble compound, or plates onto the substrate. Therefore, the abrasive with the associated activator may be stabilized. For example, the abrasive with the associated activator may be calcined. The abrasive with the associated activator may be subsequently covered with or treated with other compounds including stabilizers, surfactants, silanes, or other components. Or, the abrasive with the associated activator may be covered with or treated with other compounds and calcined.

A system with iron activator, i.e., a slurry having iron coated on solid particles contained within the slurry, shows excellent free radical activity if the amount of activator iron is about 2 to 500 ppm total activator iron, preferably 3 to 100 ppm total activator iron, and for low iron embodiments about 4 to 20 ppm total activator iron. Iron that is not contacting the fluid, including iron for example within a particle matrix where it can not generate free radicals that can escape the particle structure, is not included in the term activator iron. Iron that can not activate the formation of free radicals, for example because it is incorporated within a matrix where changes between oxidation states is discouraged, is not included in activator iron. Finally, iron that is chelated or otherwise not available for reaction with the compound that produces free radicals is not included as activator iron. An exemplary slurry has about 50 ppm to about 300 ppm total activator iron, most of it absorbed, adsorbed, or coated onto the abrasive.

In low-metal-containing-activator embodiments, less than 80 ppm total metal-containing activator in a slurry can be used. This activator may act alone, or be supplemented with for example activator on the pad and/or non-metal-containing activator in the fluid. In preferred low-metal-containing-activator embodiments, less than 40 ppm total metal-containing activator in a slurry can be used, for example between about 5 ppm and about 30 ppm, or about 5 ppm to 20 ppm. Of course, the limits on the metal content of the fluid contacting the substrate and having the compound producing the free radical and optionally other oxidizers is still important. It is highly beneficial, even when the slurry contains up to 500 ppm of activator associated with particles, to have for example less than 20 ppm, preferably less than 8 ppm, for example less than 4 ppm, of these metals in solution in the fluid contacting the substrate.

An activator associated with an abrasive means the activator is not in solution in the slurry. Metals in solution act as promoters and will therefore contaminate a substrate. Further, if chemical reactions occur to cause the activator to tend to plate out (i.e., be reduced to a metallic state), the activator will still not move from the surface of the abrasive, and therefore will not plate out on the substrate. Additionally, we have surprisingly found that activator associated with an abrasive has a much lower tendency to spontaneously decompose certain oxidants, for example hydrogen peroxide, even at higher pH values where hydrogen decomposition by metal ions in solution is known. While not being bound by theory, generally, an activator associated with an abrasive is believed to only incidentally contact the substrate.

Copper is a known Fenton's agent, and therefore copper associated with solids makes an excellent activator. As copper can shift from a cuprous and cupric oxidation states, there will always be two bonding sites whereby the copper may be associated with the active sites on the abrasive material. The copper can be associated with the abrasive in the form of a salt, for example a cupric salt, a cuprous salt, in some forms a copper oxide, and in some forms metallic metal. Generally, metallic metal will be transformed to the cupric or cuprous form in the presence of oxidizers.

Silver is a useful activator for many systems, and can be coated onto for example silica, ceria, alumina, and other known abrasives, but if silver changes oxidation states, it may under some conditions become un-associated from the solid material. Additionally, the cost of silver is prohibitive unless recovery/recycle systems are in place. Finally, silver ions can complicate disposal of used slurry.

While gold coated onto one or more abrasives may be a useful activator for many systems, unless there is rigorous recovery and recycling of the activator-coated particles, the material cost will be too great for most commercial operations. On the other hand, gold may facilitate the production of free radicals without itself changing oxidation states. The same can be said for platinum and palladium coated onto a solid.

Coated or doped noble metals (Au, Ag, Re, Ru, Rh, Pd, Os, Ir, Pt) are as a rule present in elemental form or also have oxidic surface regions.

Iron associated with an abrasive is particularly useful and is the most preferred activator. Iron associated with silica is the most preferred system. The silica, with its numerous OH groups, can multiply bind with the iron, holding the iron firmly associated with the silica by a number of covalent and/or ionic type bonds. Yet, the plurality of bonds of iron onto the silica, be it absorbed, adsorbed, or coated, allows easy transformation between oxidation states without the iron having a tendency to dis-associate from the silica surface. Surprisingly, iron associated with silica can be used at high pH values, for example from pH 5 to pH 7 and in some cases up to pH 8. It is known that soluble iron at these pH values forms undesirable precipitates which contaminate substrate and which catalyze degradation of hydrogen peroxide into oxygen and water, resulting in unsafe explosive accumulations of gases.

The iron can be associated with the abrasive in the form of a salt, for example a ferric salt, a ferrous salt, in some forms a ferric oxide, and in some forms metallic metal. Generally, metallic metal will be transformed to the ferric or ferrous form in the presence of oxidizers. An additional advantage of iron is that it is environmentally benign and does not pose significant disposal problems.

Iron associated with alumina is also a useful abrasive/activator, as is iron associated with ceria. Iron associated with polymeric particles, or particles that have a polymeric component, are also useful.

Cerium salts, be they absorbed, adsorbed, or coated onto a solid, are also very useful abrasive/activators. Like iron, these ions can be strongly held by the active sites on the abrasive and/or particle, and once absorbed, adsorbed or coated, do not tend to become un-associated with the particle. Cerium salts can be used beneficially with for example iodine.

In another embodiment, metal-containing activator compounds comprising cobalt, copper, iron, cerium, or mixtures thereof are suitable activators.

Nickel, silver, or any combination thereof are suitable activators for some compounds which produce free radicals.

In another embodiment, metal-containing compounds having standard oxidization potential of from about $-0.52$ to about $-0.25$ eV are suitable activators. Examples of metal activators with oxidation potentials in this range include copper ($-0.52$ eV), iron ($-0.44$ eV), cobalt ($-0.28$ eV), and nickel ($-0.25$ eV). In another embodiment, formation of free radicals is promoted by an electric potential externally imposed across an activator/fluid system so the activator has an oxidation potential within this range.

Descriptions of redox systems involving activators that generate free radicals in the presence of oxidizing agents are provided in Walling, C., Free Radicals in Solution (1957), pp. 564–579, and Bacon, R, The Initiation of Polymerisation Processes by Redox Catalysts, Quart. Revs., Vol. IX (1955), pp.287–310, the entire contents of which are incorporated herein by this reference. Such catalysts are candidate activators, and may be for example associated with the abrasive used in the composition.

Compounds that do not need actinic radiation, for example UV radiation, to be effective as an activator are preferred activators. It is known that titanium oxides, when activated with actinic radiation, may form free radicals under certain conditions. This is not useful under CMP polishing conditions.

However, where the production of free radicals might be promoted where the production is acceptable without actinic radiation can be included. For example, formation of free radicals may promoted by actinic radiation for certain iron-based or a copper-based activators.

A preferred Group 8 metal is iron. A preferred Group 1(b) metal is copper. Another preferred metal activator is cerium, a Group 3(b) activator. However, it is known that iron, copper, and cerium ions can cause metallic contamination of the substrate surface. Further, iron ions added as ferric nitrate to a hydrogen peroxide mixture was found to create undesirable degradation of the hydrogen peroxide and of the ferric ions. Other metallic ions have similar problems.

Surprisingly, the metal compounds, particularly the iron compounds, associated with an abrasive were found to have a large effect on the etching rate of a CMP slurry despite the fact that the iron ions largely did not contact the substrate, and did not cause direct oxidation of the substrate by taking electrons from the substrate, did not cause oxidation of the substrate by shuttling electrons from the oxidizer to the substrate. Rather, the iron compounds cause formation of free radicals, most preferably reactive oxygen radicals.

It is believed that the composition of one important embodiment of the present invention is particularly advantageous by virtue of the interaction between at least one activator that is associated with a surface of a solid and at least free radical-forming compound, i.e., oxidizing agent, that is in the fluid. That is, it is believed that a reaction takes place between the activator that is for example coated on an abrasive, and the oxidizing agent that is in the fluid, such as a peroxide or hydroperoxide, at the solid activator/liquid interface. It is believed that this reaction generates free radicals or active reaction intermediates, such as hydroxyl free radicals, at the activator surface, which favorably interact with the targeted material on the substrate when the free radicals contact the targeted substrate, which may be facilitated when the activator coating on the abrasive contacts the substrate surface.

The activator may include a metal-glycine complex, wherein the metal consists essentially of cerium, iron, manganese, cobalt, or mixture thereof.

Mixtures of activators can give increased activity. Cerium salts are particularly useful when admixed with iron or copper. Manganese salts are particularly useful when admixed with iron or copper. Rare earth metals may be useful when admixed with iron or copper. U.S. Pat. No. 5,097,071, the disclosure of which is incorporated herein by reference, teaches preparation process for an alumina supported copper useful for initiating Fenton's reaction, where the copper is impregnated with compounds of manganese and of one or more rare earth metals, having a Cu content of 0.1–5% by weight, a total content of compounds of manganese and of the rare earth metal or metals of 0.05 to 8% by weight, calculated as metals. The following may be mentioned as rare earth metals (subgroup III of the periodic table of elements): scandium, yttrium, lanthanum and the lanthanies. Yttrium, lanthanum, cerium, praseodymium, neodymium and dysprosium are preferred, cerium and lanthanum are particularly preferred and cerium is very particularly preferred.

In some embodiments, compounds of Ag, Cr, Mo, Mn, Nb, Nd, Os, Pd, Pt, Rh, Ru, Sc, Sm, Ta, Ti, V, or W which are associated with the surface of a particle which contains activator are useful. They may facilitate the action of the activators or with some compounds that form free radicals they may themselves become activators.

Fluid Additives

The fluid composition contains one or more compounds that produce free radicals, and contains or contacts one or more activators. The composition may contain a variety of other additives, such as a typical abrasive (i.e., an abrasive lacking a activator coating); other abrasives or particles, which may or may not be of the same characteristics (material, size, and the like) as activator-containing particles; one or more typical oxidizing agents (i.e., an oxidizer that is not a free radical producer); promoters; surfactant; stabilizing and passivating agents; dispersion agents; chelators; film-forming anticorrosion agents; a polish enhancement agent; and/or pH adjusting agents.

In some embodiments, for example when the abrasives or other particles having the activator associated with the surface are to be stored or handled, or when the activator makes a portion of the slurry unstable, the surface of the activator can be passivated. Passivating agents are beneficially relatively insoluble with respect to the bound activator (will not cause the activator to leave the particle) and also to have an affinity for the activator-coated particle. At selected pH values, selected carboxylic acid salts, for example oxalate, gallate, citrate, and the like can be made to coat the activator-containing particles. These passivators often can eliminate free radicals, which further enhances stability. Other passivators include succinates, benzoates, formates, cupferons, and 8-hydroxyquinoline. However, it is generally advisable to have the pH and or ionic conditions change prior to polishing so that the activator can be exposed and function.

Particles having the activator can be treated with various agents to enhance colloidal stability, including carboxylic acids and polycarboxylic acids.

Promoters

As stated above, although metals having multiple oxidation states that are dissolved in the fluid contacting the substrate can act as oxidizers, the most preferred embodiments of this invention have substantially no metals having multiple oxidation states.

In some embodiments, compounds of Al, Ag, Ce, Co, Cr, Cu, Fe, Mo, Mn, Nb, Nd, Ni, Os, Pd, Pt, Rh, Ru, Sc, Sm, Ta, Ti, V, or W in minor amounts dissolved in the solution are useful. These are believed to facilitate the action of the oxidizers, as discussed in U.S. Pat. No. 5,958,288, the disclosure of which is incorporated herein by reference. Metal ions in solution are believed to act as oxidizers with a degree of affinity to the substrate, particularly to metal substrates. If they are able to be oxidized by other oxidizers in the fluid, there will be some synergistic action between the two. In most cases the promoters are believed not to facilitate the action of the free radicals, however. Compounds that form promoters on exposure to a catalyst or substrate, such as those compounds described in U.S. Pat. No. 5,863,838, the disclosure of which is incorporated by reference, are also useful.

In some embodiments of the present invention, the fluid composition contacting the substrate has a small amount of metal ion oxidizers, herein called promoters. Soluble compounds or salts of copper, aluminum, cerium, and iron are used as oxidizers or promoters in CMP solutions. If used, a preferred metal-containing oxidizer promoter is soluble cerium salts or aluminum salts.

A promoter has some effect at low concentrations, about as low as 4 ppm. As this affinity between promoters and substrates in turn results in the probability of metallic ion contamination of the substrate, the fluid beneficially contains less than 5000 ppm, preferably less than 2000 ppm, more preferably less than 500 ppm (0.05%) of dissolved metal-containing promoters, particularly copper, cerium, and iron. In preferred embodiments of this invention, the fluid composition contacting the substrate has less than 50 ppm, preferably less than 20 ppm, and more preferably less than 10 ppm total of dissolved metal-containing promoters, particularly copper and iron.

In preferred low-(dissolved)-metal-containing embodiments of this invention, the fluid composition contacting the substrate has less than 50 ppm, preferably less than 20 ppm, and more preferably less than 10 ppm of dissolved metals having multiple oxidation states.

In preferred no-(dissolved)-metal-containing embodiments of this invention, the fluid composition contacting the substrate has less than 5 ppm of dissolved metals having multiple oxidation states, for example less than 2 ppm of dissolved metals having multiple oxidation states. One example that performed well had less than 1 ppm of dissolved metals having multiple oxidation states, though it had been in contact with an abrasive having an activator associated on the surface thereof. In the most preferred embodiments of this invention, the fluid composition contacting the substrate has less than 5 ppm, for example less than 2 ppm, of total dissolved copper, aluminum, cerium, and iron.

If copper or iron are present in dissolved form, it is preferred that they be in chelated form, which essentially isolates these metals from the fluid and from the substrate and makes them not useful as an oxidizer or as a promoter. For iron in particular, in preferred embodiments the fluid contacting the substrate has less than 8 ppm, preferably less than 4 ppm, more preferably less than 2 ppm, most preferably less than 1 ppm of iron salts or compounds dissolved in the fluid, i.e., the liquid portion of the slurry.

Additionally, for the same reasons as above for metal oxidants, metal salts of other components are generally discouraged. These include sodium salts (such as sodium periodate), potassium salts (such as potassium persulfate), lithium salts, and the like. Generally, potassium salts are much less prone to creating contamination than are sodium salts. It is also or alternatively preferred to have less than 2000 ppm of total metals dissolved in the fluid portion of the CMP slurry, and it is more preferred to have less than 500 ppm, for example less than 50 ppm, and in a metal-free embodment less than 10 ppm, of total metals dissolved in the fluid portion of the CMP slurry. By total metals, it is meant metals in groups 1(a), 2(a), 3(b), 4(b), 5(b), 6(b), 7(b), 8, 1(b), and 2(b).

Chelators

If no-(dissolved)-metal-containing embodiments are desired, the fluid may have chelators. Chelators can essentially trap and isolate metals having multiple oxidation states that are present in dissolved form in the fluid. If dissolved metals are in chelated form, this essentially isolates them from the substrate, which impairs their efficiency as a promoter but prevents metal ion contamination. This can extend the potlife of a slurry of oxidizer, however, and at low concentrations the chelators will not effectively impair the efficiency of the free radicals.

Therefore, only small amounts of chelator should be used. Chelators generally contain organic acid moieties, which can act as free radical quenchers. This could adversely effect the system performance.

Generally, less than 3%, preferably less than 1%, for example less than 0.5% by weight of chelators are preferred.

Stabilizers

The composition may also include one or more of various optional additives. Suitable optional additives include stabilization agents. These optional additives are generally employed to facilitate or promote stabilization of the composition against settling, flocculation (including precipitation, aggregation or agglomeration of particles, and the like), and decomposition. Stabilizers can be used to extend the pot-life of the oxidizing agent(s), including compounds that produce free radicals, by isolating the activator material, by quenching free radicals, or by otherwise stabilizing the compounds that form free radicals.

Some materials are useful to stabilize hydrogen peroxide. One exception to the metal contamination is the presence of selected stabilizing metals such as tin. In some embodiments of this invention, tin can be present in small quantities, typically less than about 25 ppm, for example between about 3 and about 20 ppm. Similarly, zinc is often used as a stabilizer. In some embodiments of this invention, zinc can be present in small quantities, typically less than about 20 ppm, for example between about 1 and about 20 ppm. In another preferred embodiment the fluid composition contacting the substrate has less than 500 ppm, for example less than 100 ppm, of dissolved metals, except for tin and zinc, having multiple oxidation states. In the most preferred commercial embodiments of this invention, the fluid composition contacting the substrate has less than 9 ppm of dissolved metals having multiple oxidation states, for example less than 2 ppm of dissolved metals having multiple oxidation states, except for tin and zinc. In some preferred embodiments of this invention, the fluid composition contacting the substrate has less than 50 ppm, preferably less than 20 ppm, and more preferably less than 10 ppm of dissolved total metals, except for tin and zinc.

As metals in solution are generally discouraged, it is preferred that those non-metal-containing oxidizers that are typically present in salt forms, for example persulfates, are in the acid form and/or in the ammonium salt form, such as ammonium persulfate.

Other stabilizers include free radical quenchers. As discussed, these will impair the utility of the free radicals produced. Therefore, it is preferred that if present they are present in small quantities. Most antioxidants, i.e., vitamin B, vitamin C, citric acid, and the like, are free radical quenchers. Most organic acids are free radical quenchers, but three that are effective and have other beneficial stabilizing properties are phosphonic acid, the binding agent oxalic acid, and the non-radical-scavenging sequestering agent gallic acid.

In addition, it is believed that carbonate and phosphate will bind onto the activator and hinder access of the fluid. Carbonate is particularly useful as it can be used to stabilize a slurry, but a small amount of acid can quickly remove the stabilizing ions. Stabilization agents useful for absorbed activator can be film forming agents forming films on the silica particle.

Suitable stabilizing agents include organic acids, such as adipic acid, phthalic acid, citric acid, malonic acid, orthophthalic acid; and, phosphoric acid; substituted or unsubstituted phosphonic acids, i.e., phosphonate compounds; nitriles; and other ligands, such as those that bind the activator material and thus reduce reactions that degrade the oxidizing agent, and any combination of the foregoing agents. As used herein, an acid stabilizing agent refers to both the acid stabilizer and its conjugate base. That is, the various acid stabilizing agents may also be used in their conjugate form. By way of example, herein, an adipic acid stabilizing agent encompasses adipic acid and/or its conjugate base, a carboxylic acid stabilizing agent encompasses carboxylic acid and/or its conjugate base, carboxylate, and so on for the above mentioned acid stabilizing agents. A suitable stabilizer, used alone or in combination with one or more other stabilizers, decreases the rate at which an oxidizing agent such as hydrogen peroxide decomposes when admixed into the CMP slurry.

On the other hand, the presence of a stabilization agent in the composition may compromise the efficacy of the activator. The amount should be adjusted to match the required stability with the lowest adverse effect on the effectiveness of the CMP system. In general, any of these optional additives should be present in an amount sufficient to substantially stabilize the composition. The necessary amount varies depending on the particular additive selected and the particular make up of the CMP composition, such as the nature of the surface of the abrasive component. If too little of the additive is used, the additive will have little or no effect on the stability of the composition. On the other hand, if too much of the additive is used, the additive may contribute to the formation of undesirable foam and/or flocculant in the composition. Generally, suitable amounts of these optional additives range from about 0.001 to about 2 weight percent relative to the composition, and preferably from about 0.001 to about 1 weight percent. These optional additives may be added directly to the composition or applied to the surface of the abrasive component of the composition.

pH Adjustors

The pH of the composition is desirably on the order of from about pH 1 to about pH 11, and preferably, from about pH 2 to about pH 8. These pH levels, and particularly the preferred levels, are believed to facilitate control of the CMP process. A composition having a pH that is too low, such as below pH 2, may present problems in terms of the handling of the composition and the quality of the polishing itself. A composition having a pH that is too high, such as above pH 11, may detrimentally contribute to corrosion or other attack on the metal layer, such as copper or tungsten, on the substrate surface, depending on the nature of the metal layer. This may not be an issue in the polishing of metal layers such as aluminum or exotic metals, which may tolerate a CMP composition of relatively high pH without ill effect.

The pH of the composition may be adjusted using an appropriate pH adjusting agent, such as a suitable acid, base, amine, or any combination thereof. Preferably, a pH adjusting agent used in the composition does not contain metal ions, such that undesirable metal components are not introduced into the composition. Suitable pH adjusting agents include amines, ammonium hydroxide, nitric acid, phosphoric acid, sulfuric acid, organic acids, and/or salts thereof, and any combination thereof. The pH level of the composition should could be as low as about pH 1.5, but the formulation becomes difficult to work with at that low pH. Generally, the fluid pH is kept in a range of from about pH 2 to about pH 11, with a preferred upper level of about pH 8. The more preferred range is about pH 3 to about pH 7.5, for example pH between pH 3.5 and pH 4.5.

Surfactants

While there are many suitable surfactant additives for the composition, preferred surfactant additives include dodecyl sulfate sodium salt, sodium lauryl sulfate, dodecyl sulfate ammonium salt, and any combination thereof. Suitable commercially available surfactants include TRITON DF 16™ manufactured by Union Carbide and SUIRFYNOL™ manufactured by Air Products and Chemicals.

Various anionic and cationic surfactants having molecular weight in the range from less than 1000 to greater than 30,000 are contemplated as dispersants. Included are sodium, potassium, or preferably ammonia salts of stearate, lauryl sulfate, alkyl polyphosphate, dodecyl benzene sulfonate, disopropylnaphthalene sulfonate, dioctylsulfosuccinate, ethoxylated and sulfated lauryl alcohol, and ethoxylated and sulfated alkyl phenol.

Various cationic surfactants include polyethyleneimine, ethoxylated fatty amine and stearylbenzyldimethylammonium chloride or nitrate. Alternate dispersants contemplated in the present invention include: polyethylene glycols, lecithin, polyvinyl pyrrolidone, polyoxyethylene, isoctylphenyl ether, polyoxyethylene nonylphenyl ether, amine salts of alkylaryl sulfonates, polyacrylate and related salts, polymethacrylate.

If a surfactant is added to the first CMP slurry, then it may be an anionic, cationic, nonionic, or amphoteric surfactant or a combination of two or more surfactants can be employed. Furthermore, it has been found that the addition of a surfactant may be useful to reduce the within-wafer-non-uniformity (WIWNU) of the wafers, thereby improving the surface of the wafer and reducing wafer defects.

In general, the amount of additive such as a surfactant that may be used in the first CMP slurry should be sufficient to achieve effective stabilization of the slurry and will typically vary depending on the particular surfactant selected and the nature of the surface of the metal oxide abrasive. For example, if not enough of a selected surfactant is used, it will have little or no effect on first CMP slurry stabilization. On the other hand, too much surfactant in the CMP slurry may result in undesirable foaming and/or flocculation in the slurry. As a result, stabilizers such as surfactants should generally be present in the slurry of this invention in an amount ranging from about 0.001% to about 0.2% by weight, and preferably from about 0.001 to about 0.1 weight percent. Furthermore, the additive may be added directly to the slurry or treated onto the surface of the metal oxide abrasive utilizing known techniques. In either case, the amount of additive is adjusted to achieve the desired concentration in the first polishing slurry.

Polishing-Enhancement Additives

Optionally, certain additives or polish enhancement agents may be added to the composition to enhance or improve the polishing rate of targeted material on the substrate surface, such as tantalum and titanium material often present in the form of barrier layers on the substrate surface. An example of a polish enhancement agent is hydroxylamine, which is particularly effective when the targeted material is tantalum. Polishing enhancement agents other than hydroxylamine, such as fluoride based agents, are generally preferred for use with peroxide-containing compositions. The optional polishing enhancement agent, if any, is generally present in an amount of from about 0.001 to about 2 weight percent, or preferably, from about 0.001 to about 1 weight percent, relative to the composition.

Other polishing enhancers can include glycols, including mono, di, and tri ethylene glycols and the like, glycine or derivatives thereof such as glycine having between one and three C1 to C4 alkyl groups substituted on the nitrogen, the OH moiety, or both, or mixture thereof, in an amount between about 0.05% to about 5%, preferably between about 0.1% to about 1% by weight of slurry.

Other polishing enhancers include nucleophilic amines and alkanolamines, which can be present in amounts from about 0.01% to about 30%, for example between about 0.01% and 3%.

Film-Forming Anticorrosion Compounds

Its known that some oxidation reactions can occur too fast, especially on susceptible metals such as copper. For this reason it is sometimes beneficial to have one or more film forming agents in the slurry. Film forming agents have a tendency to adhere to one or more metals, partially protecting the metals from the actions of the oxidizer and/or free radicals.

The CMP composition may include an optional film forming agent. The film forming agent may be any compound or mixtures of compounds that are capable of facilitating the formation of a passivation layer of metal oxides and dissolution inhibiting layers on the surface of the metal layer. Passivation of the substrate surface layer is important to prevent wet etching of the substrate surface. Useful film forming agents are nitrogen containing cyclic compounds such as imidazole, benzotriazole, benzimidazole and benzothiazole and their derivatives with hydroxy, amino, imino, carboxy, mercapto, nitro and alkyl substituted groups, as well as urea, thiourea and others. Preferred film forming agents include benzotriazole ("BTA"), thiazole, and thiocarbamamide.

The optional film forming agent may be present in the first CMP slurry of this invention in an amount ranging from about 0.01 weight percent to about 1.0 weight percent. It is preferred that film forming agent is present in the first CMP slurry in an amount ranging from about 0.01 to about 0.2 weight percent.

Abrasive Particles

The CMP slurry of the present invention may comprise one or more particulates, herein termed abrasives. The abrasive particle may be a metal oxide particle, a resinous particle, or a plastic particle, and is preferably a metal oxide particle.

Advantageously, the abrasives are engineered to provide the desired combination of particle size, hardness, surface area, inertness, selectivity, and ability to remain suspended in a formulation. While for some applications grit or sand can be useful as an abrasive, for semiconductors, memory devices, and the like much smaller particles are required. For semiconductors, particles with an average size of between about 1 and about 4000 nanometers are useful. The BET surface area of the metal oxide or metalloid oxide can be between about 5 and about 1000 $m^2/g$. Generally, it is preferred that the particles have a similar surface area, such that for example at least 90% by weight of the particles have a surface area within about 20%, preferably within about 10%, of the mean average surface area of the particles.

It is within the ability of one of ordinary skill in the art, with the benefit of this disclosure, to maximize the content of the useful activator on abrasive, or to alter the abrasive properties including mineral content, particulate size, the surface area, and the surfactants, stabilizers, and other compounds to keep the particles comprising the activator suspended in for example a colloid form.

Particle size distribution is important. Generally, superior polishing is achieved with a solution of equally sized particles of a given type. Also, large particles, i.e., particles that are more than about two or three times the average particle size, are generally responsible for most scratching and damage of substrates. In a preferred embodiment, the particle size distribution can be expressed as in U.S. Pat. No. 5,626,715, the contents of which is incorporated herein by reference. Abrasive particles, for example alpha aluminum oxide particles or silica particles or ceria particles, used for polishing have a particle size of 1 to 100 nm, and the distribution (one sigma deviation) is controlled to within 20%, preferably 10%, of the particle size.

In one embodiment, for most types of abrasive particles in a slurry where the aggregate size distribution is less than about 4 microns and the mean aggregate diameter is between about 0.2 microns to about 1 micron, it is advantageous to have a restricted particle size distribution such that greater than 70%, preferably greater than 80%, by weight of the particles have a size that is within 20% of the average size, and less than 10%, preferably less than 5%, by weight of the particles have a size more than 100% over the average size. Further, essentially none, i.e., less than 0.5%, preferably less than 0.1%, by weight of the particles have a size more than 200% over the average size.

In another embodiment, for most types of abrasive particles in a slurry where the aggregate size distribution is less than about 0.5 microns and the mean aggregate diameter is between about 0.005 microns to about 0.2 micron, it is advantageous to have a restricted particle size distribution such that greater than 50%, preferably greater than 80%, by weight of the particles have a size that is within 20% of the average size, and less than 20%, preferably less than 10%, by weight of the particles have a size more than 100% over the average size. Further, essentially none, i.e., less than 5%, preferably less than 1%, by weight of the particles have a size more than 200% over the average size.

In another embodiment, the particles can comprises a metal oxide produced by a process selected from the group consisting of a sol-gel process, a hydrothermal process, a plasma process, a fuming process, a precipitation process, and any combination thereof.

While sharp edges on abrasives give faster polishing, in many instances speed can be sacrificed if there is less scratching of the kind which results in degradation of performance of the substrate product. Even particles as small as 0.1 micron give unacceptable scratches for some applications. In some embodiments, therefore, the abrasive is a substantially spherical particle. By substantially spherical it is meant that the radius in any direction is within about 30%, preferably within about 20%, even more preferably within about 10%, of the average radius for that particle.

Ceramic particles are also useful particles and abrasive materials for this invention. Suitable ceramic particles are available commercially. The ceramic particle size ranges from greater than one micron to about 0.01 microns, and preferred sizes are between about 0.01 microns to about 0.2 microns. Smaller sizes than 0.01 microns are expected to provide excellent results when they can be produced at reasonable cost. The term ceramic powders defined to include metallic oxides such as zinc oxide, bismuth oxide, cerium oxide, germanium oxide, silica, or aluminum oxide, or mixtures thereof; metallic sulfides, metallic titanates, metallic borides, metallic nitrides, metallic carbides, metallic tellurides, metallic arsenides, metallic silicides, metallic selenides, and metallic halides; and including mixed materials such as metallic titanates, metallic tantalates, metallic zirconates, metallic silicates, metallic germinates, and metallic niobates. The metal component of the metallic oxides may include those metals of the periodic table of elements found in groups IIA through IIB, and also including the Lanthanum and Actinium series. In one embodiment, ceramic powders are defined to include metal oxides containing one or more dopants. As the quantity of dopants to be added is normally a small weight percent of the total solids, the addition of a dopant generally does not affect the physical characteristics of the slip or suspension. Those skilled in the art will therefore recognize that a variety of "dopants" may be used. The term "dopants" shall be defined to include an additive which is used to tailor the electrical properties and/or the binding properties of the ceramic powder. In the present invention, dopants may be defined to include one or more metal compounds, typically metal oxides, selected from the group consisting of aluminum, antimony, bismuth, boron, calcium, cadmium, chromium, copper, cobalt, hafnium, iron, lanthanum, lead, manganese, molybdenum, neodymium, nickel, niobium, praseodymium, samarium, scandium, silicon, silver, tantalum, titanium, tin, tungsten, vanadium, yttrium, zinc, and zirconium. The dopants can change the zeta potential of the particles, altering the stability of a colloid thereof, and/or be treated to become an active activator, and/or be useful for securing the activator to selected sites on the particle. One ceramic particle that can be useful is barium titanate, commercially available in spherical form as BT-10 (TM, Cabot Corporation) having an average particle size of about 0.1 micron. Often, lighter materials are desired. Another useful ceramic sphere is a spherical aluminum oxide particle. These particles have the added feature that substantially all the surface area is outside surface area, and there is little porosity. The ceramic particles of U.S. Pat. Nos. 6,214,756 and 6,514,894, the disclosures of which are incorporated here by reference, form suitable abrasive powders for the CMP system of the current invention. Preferred ceramic powder particles are substantially spherical with a very controlled particle size, for example, greater than about 80% of the particles are within 15% of the average particle size, and greater than 99% of the particles are within about 30% of the average particle size. Further, these patents teach a coating to form a stable suspension of ceramic particles by forming a coating on the particles which weakens the zeta potential-related inherent inter-particle attraction.

Generally, the activator is associated with the surface area of the particle. In most preferred embodiments, the activator is associated with the outer surface area and with the area just inside pores, which is called here the "outside surface area". One method of quantifying this is the pore volume in the outer surface and in the 10% of the surface area within the particle that is closest to the outer surface. In addition to being easier to place selected activators on this surface, the free radicals generated by the interaction of the activator and the compounds that produce free radicals can easily move from the abrasive and contact the substrate. In some embodiments, therefore, the activator covers some or all of this outside surface area. The activator may be associated with and cover between about 0.01% to about 100% of the outside surface area of the abrasive. In some embodiments, the activator covers between about 0.01% and about 5% of the outside area.

The very high surface area alumina particles also have surface area that is less accessible to fluids, compounds producing free radicals, and the like. Additionally, free radicals produced in some inside pores may cease to exist before the free radicals escape the particle pore structure. While activator may also beneficially be associated with this "inside" surface area, this activator will be less effective on a weight basis than activator associated with the outside surface. The activator may be associated with and cover between about 0.01% to about 100% of the surface area of the abrasive.

In some embodiments, the abrasive comprises particles ranging from about 1 to about 100 nanometers, say for example about 10 nanometers. U.S. Pat. No. 5,128,081, the contents of which is incorporated here by reference, describes a method of manufacturing particles of metal oxide particles suitable for use with the current invention with a particle size range of from 1 to 100 nanometers and with a very narrow particle size distribution, including nanocrystalline alpha alumina. The patent discloses an apparatus for preparation of nanocrystalline or nanophase materials which include crystalline, quasicrystalline and amorphous phases. The patent discusses the preparation of nanocrystalline aluminum oxide, with a treatment that results in transformation of nanocrystalline aluminum powders (likely with a very thin oxide coating) to the thermodynamically stable alpha phase of aluminum oxide having an average particle size of about 18 nm. Abrasives mentioned in U.S. Pat. No. 4,910,155, the disclosure of which is incorporated herein, are suitable, including 0.06 micron alumina particles, silica particulates with an average diameter of 0.02 microns, and particulates of sizes as small as 0.006 microns average size.

One advantage of the systems of this invention is that very small, for example 1 to 10 nanometer particles, can be used and still very high material removal rates, for example about 1000 angstroms to about 6000 angstroms per minute can be obtained. Further, with the small particles scratches are substantially reduced. Of course, even higher removal rates can be achieved with more aggressive chemistries. For example, some tests showed removal rates in excess of 15000 angstroms per minute with sub-micron sized particles. But, this removal rate is generally considered too high to control with current semiconductor processing tools.

The abrasive is generally in the form of an abrasive particle, and typically many abrasive particles, of one material or a combination of different materials. Generally, a suitable abrasive particle is more or less spherical and has an effective diameter of about 30 to about 170 nanometers (nm), although individual particle size may vary. Abrasive in the form of aggregated or agglomerated particles are preferably processed further to form individual abrasive particles. A slurry may have more than one type of abrasive, and it may be advantageous to have different sizes for different types of abrasives.

A suitable metal oxide abrasive can be a metal oxide or metalloid oxide or a chemical mixture of metal oxides or metalloid oxides. Suitable metal oxide abrasive includes, but is not limited to, alumina, ceria, germania, silica, spinel, titania, an oxide or nitride of tungsten, zirconia, or any of the above doped with one or more other minerals or elements, and any combination thereof. The metal oxide abrasive may be produced by any of a variety of techniques, including sol-gel, hydrothermal, hydrolytic, plasma, pyrogenic, aerogel, fuming and precipitation techniques, and any combination thereof.

Precipitated metal oxides and metalloid oxides can be obtained by known processes by reaction of metal salts and acids or other precipitating agents. Pyrogenic metal oxide and/or metalloid oxide particles are obtained by hydrolysis of a suitable, vaporizable starting material in a oxygen/hydrogen flame. An example is pyrogenic silicon dioxide from silicon tetrachloride. The pyrogenic oxides of aluminum oxide, titanium oxide, zirconium oxide, silicon dioxide, cerium oxide, germanium oxide and vanadium oxide and chemical and physical mixtures thereof are suitable.

The abrasive may be a mixed oxide. We have found that certain activators are more closely held by silica than by alumina under certain conditions. A process for the preparation of mixed oxides is described, for example, in EP-A-1048617. In a pyrogenic process, an $SiCl_4/AlCl_3$ mixture is brought together in an oxygen/hydrogen flame and a mixed oxide of silicon dioxide and aluminum oxide material is obtained in a hydrolysis step, forming a mixed oxide particle consists of the two molecular species $SiO_2$ and $Al_2O_3$. Such a mixed-oxide particle will under some conditions have a greater affinity to (or tenacity with) the associated activator than single metal oxide particles.

Abrasives comprising alumina coated silica can also be useful.

In one preferred embodiment, the metal oxide abrasive is a precipitated or fumed abrasive, and preferably a fumed abrasive. By way of example, a fumed metal oxide abrasive may be a fumed silica or fumed alumina or a fumed silica/alumina.

In one embodiment, the activator may be incorporated into the matrix of the abrasive particle. If a abrasive particle is precipitated, for example from a sol, one or more activators may be added to the sol such that the activator compounds (or elements) are incorporated into the abrasive particle, provided a sufficient amount of the activator is at the surface of the abrasive and is or can be put into an active state. If the abrasive is made by a pyrogenic or fumed process, compounds can be added to the material being fumed, thereby incorporating the material into the formed particle. The doped, pyrogenic oxides described in DE-A-196 50 500 may incorporate activators into the abrasive matrix. The doping component, which is distributed in the entire particle, changes the structure and the properties of the particular particle and therefore the polishing properties, such as rate of removal of material and selectivity. Or, forming particles can be admixed with salts of activators, where the salts may be fused to the surface of forming particles.

Abrasives can generally be used for many metals and combinations of metals, though it is known in the art that ceria, silica, and alumina are each preferentially used in certain conditions with certain combinations of metals.

One abrasive can be alumina. The alumina can be present here in various forms, including amorphous or crystalline forms. The crystalline forms including the alpha, gamma, delta, theta and kappa types, as well as pyrogenic aluminum oxide, named for its preparation process, and mixtures of the abovementioned aluminum oxides. The alumina can be a mixture of phases, and/or can be doped with one or more adjuvants.

The alumina may or may not be pure. For example, metal oxide particles which may or may not themselves be alumina can be coated with an alumina containing one or more activators, where the alumina-activator coating is adhered (for example, adsorbed or absorbed) to the outside of the abrasive, or the alumina-activator coating is fused to the outside of the abrasive, or the alumina-activator alumina-activator coating is in particulate form trapped within the porosity of an abrasive, or an alumina-activator coating is in particulate form and is fused to the abrasive, or a combination thereof.

In some embodiments, the activator is doped into the abrasive. For example, it is possible to formulate abrasive wherein a desired amount of activator is included within the abrasive matrix, provided that the abrasive so manufactured has the required amount of activator in contact with the fluid containing the Free Radical-Producing Compound, and providing the activator so exposed to the fluid can cause the desired increase in free radical formation. Generally, in another embodiment, it may be advantageous to have sites comprising elements or compounds in the alumina matrix which allow the alumina to more closely hold the selected activators coated, absorbed, or adsorbed onto the surface. An abrasive, for example alumina, having doped therein at least 0.01%, preferably at least 1%, of compounds that if exposed at the surface act as activators or facilitate adherence of activators to the surface of the abrasive are preferred.

While any alumina is useful, surface area between about 3 and about 800, for example between about 100 and 600, square meters per gram may be particularly useful for semiconductor substrates. The alumina and silica abrasives of U.S. Pat. No. 5,527,423, the disclosure of which is incorporated herein by reference. Of course, the aluminum particles that contain activator affixed thereto will not be "high purity as defined in that patent, but the described alumina and silica particles make a good abrasive substrate for having activator associated thereon.

For titanium and tungsten, alumina particles having a primary particle diameter less than 0.400 micron and a surface area ranging from 5 to 430 square meters per gram, for example between about 10 and 250 square meters per gram, or between about 30 and 170 square meters per gram, may be preferred. Generally, it is preferred that the particles have a similar surface area, such that for example at least 90% by weight of the particles have a surface area within about 20% of the mean average surface area of the particles.

Silica is the preferred abrasive. Silica, treated to expose a number of —OH groups, can bind to or hold the activator, say iron, by a number of bonds. Therefore, the activator is robust when deposited on silica, but is also so tightly bound that iron does not leave the surface of the silica in the course of repeated interactions with the compound that produces free radicals. The BET surface area of the silica is typically between about 5 and about 1000 m$^2$/g, though the upper limit can be extended as nanometer sized particles are used. The silica can be any of precipitated silica, fumed silica, silica fumed, pyrogenic silica, silica doped with one or more adjutants, or any other silica-based compound. In an alternate embodiment the silica can be produced, for example, by a process selected from the group consisting of a sol-gel process, a hydrothermal process, a plasma process, a fuming process, a precipitation process, and any combination thereof. The silica in one embodiment is advantageously at a particle size between about 2 and about 200 nanometers, for example between about 8 and about 40 nanometers. Of course, these are average particle size diameters, and a tight particle size distribution, i.e., greater than 99% of the particles by weight are within about 30%, preferably within about 15%, of the average particle size is desired.

In general, the above-mentioned abrasives may be used either alone or in combination with one another, although any combination that might undesirably complicate the CMP process is preferably avoided. U.S. Pat. No. 5,264,010, the disclosure of which is incorporated by reference, describes for example abrasive combinations of ceria, fumed silica, and precipitated silica. In this invention, such combinations can be used, and the activator may be associated with one or more of the abrasive types in the slurry. Certain forms of iron oxide, iron hydroxide, and iron nitride abrasives are preferentially avoided, as are others that may contaminate the substrate or cause catalytic degradation of the oxidizers and/or compounds that produce free radicals (without production of the desired radicals). Copper can have the same effect as iron.

Polymeric Particles

The particle can also be partially or fully made of a polymer, resin, ionomer, or combination thereof. The particles can be solid polymeric type particles. The polymeric particle may be deformable or relatively stiff, and each has a desired characteristic known to those of skill in the art. As mentioned above, plastic or resinous abrasives are suitable components of the composition of the present invention. For example, a suitable plastic abrasive particle may be composed of a polyacrylic acid, a polymethylacrylic acid, a polyvinyl alcohol, or any combination thereof. Further by way of example, a suitable resinous abrasive particle may be composed of a polyacrylic acid, a polymethylacrylic acid, a polymelamine, or any combination thereof, or any particle of a ion exchange resin, such as a plastic ion exchange resin.

Polymeric or resinous abrasives are suitable components of the composition of the present invention. For example, a suitable plastic abrasive particle may be composed of a polyacrylic acid, a polymethylacrylic acid, a polyvinyl alcohol, or any combination thereof. Further by way of example, a suitable resinous abrasive particle may be composed of a polyacrylic acid, a polymethylacrylic acid, a polymelamine, or any combination thereof, or any particle of a ion exchange resin, such as a plastic ion exchange resin. One embodiment includes a coated particle comprising resin or plastic impregnated with abrasive metal oxide particles. Resin or polymeric particles of between 200 to 400 nanometers with smaller metal oxide particles, between about 2 to about 50 nanometers, can be embedded thereon or on the surface. Said embedded particles may carry the activator. Alternatively, a resin or polymeric particle can substantially encapsulate a metal oxide particle.

Published U.S. application Ser. No. U.S. No. 2002/1,093,451, incorporated herein by reference, describes polymer particles having functional groups thereon which react with metal. While in some embodiments an activator can interact with a substrate, by far the dominant effect of activators is not to interact with the substrate but rather to interact with the compound that produces free radicals to form free radicals. In some embodiments, the particles can have a crosslinked structure. The polymer can be a compound having two or more copolymerizable double bonds in the molecule, for example, a divinyl compound of which divinylbenzene is representative, or a polyvalent acrylate compound of which ethyleneglycol diacrylate, ethyleneglycol dimethacrylate, trimethylolpropane triacrylate and trimethylolpropane trimethacrylate are representative. These crosslinkable monomers may be used alone or in combinations of two or more.

Selected resin or plastic particles may not be considered abrasives in certain systems, but these particles can nevertheless be effective carriers of the activator. It is imperative, however, that if the polymeric particles have transition-metal-containing activators associated thereon, that these activator be accessible to the fluid and that these activators be in a form that can cause the compound that produces free radicals to be activated and to form the desired free radicals. As polymeric particles may be worn during use, having activators within the particle matrix that will eventually be contacting a fluid containing the compound that produces free radicals is also advantageous. Generally, a monolayer of activator atoms associated with the surface of the particles that contacts the fluid and promotes free radical formation where the free radicals can contact the substrate will provide maximum activity. However, as polymeric particles may wear, having between 0.1 and 20% activator within a polymer particle matrix can be advantageous.

In one embodiment of the invention, a metal oxide particle has polymer, resin, ionomer, or combination thereof within at least some of the pore space. For example, the polymer, resin, ionomer, or combination thereof may substantially, i.e., greater than about 70%, fill up the pore volume of for example a metal oxide, say alumina, silica, combinations thereof, and the like. In another embodiment, the polymer, resin, ionomer, or combination thereof may only fill the outer 10 to 40% of the pore volume of for example a metal oxide, say alumina, silica, combinations thereof, and the like. Alternatively, the polymer, resin, ionomer, or combination thereof may substantially, i.e., greater than about 70%, cover the surface of a particle. The polymeric material may be such that the matrix metal oxide materials are substantially totally encapsulated or surrounded, i.e., a coated substrate, or a portion of the substrate may be coated by the polymeric material. In another embodiment of the invention, a particle made from a polymer, resin, ionomer, or combination thereof may have incorporated at least on the surface thereof metal oxide particles that are less than about 25%, preferably less than about 10%, of the polymeric particle size. In any of these cases, the activator may be on the exposed (to the fluid) surface of the polymer, on the exposed (to the fluid) surface of one or more associated metal oxide particles, or a combination thereof.

A method of coating for example iron onto a polymer, resin, ionomer, combination thereof, or the like are discussed in for example U.S. Pat. No. 5,352,517, the disclosure of which is incorporated by reference. The polymer, resin, ionomer, combination thereof, or the like may be a thermoplastic material or a thermoset material. Among the thermoplastics useful in the present invention are the polyolefins; poly vinyl polymers; polystyrene, epoxies, phenol-formaldehyde polymers, polyesters, polyvinyl esters, polyurethanes, melamine-formaldehyde polymers, urea-formaldehyde polymers, polyacrylates, ionomeric polymers, and mixtures thereof. Similarly, U.S. Pat. No. 4,642,161, the disclosure of which is incorporated herein by reference, teaches a method of bonding for example copper and a resin together forming a copper layer on the surface of copper bonded to a resin. These same methods can be used, with minor modifications, to incorporate activator onto polishing pads.

Particles with Associated Activator

A wide variety of abrasives and particles have been discussed. As used herein, unless specifically noted the term abrasive is meant to include all particles, and the term particles is meant to include all abrasives. This list is not exhaustive, however, as we have not found abrasive substrates yet where activator associated on the surface thereof can not be active with at least some oxidative compounds that form free radicals, i.e., superoxygen radicals, hydroxyl radicals, and the like.

The activators, particularly the metal-containing activators, are advantageously associated with a surface of a particle. The particle onto which the activator(s) is/are associated can be a metal oxide particle, a metal nitride particle, a ceramic particle, a polymeric particle, any of the various combinations discussed herein, and any other particle where the particle is in contact with the fluid and the fluid contains a free oxygen generator. Of course, oxygen-containing free radicals are the most advantageous, as these free radicals have a very large although non-specific oxidizing potential.

Generally, in most preferred embodiments the activator is associated with the surface area of the particle. According to one embodiment of the present invention, an abrasive is at least partially coated by an activator. The activator enhances, or increases, the rate of the chemical reaction between the oxidizing agent of the composition and the targeted material, particularly metal material, on the substrate surface during a CMP process. Without being bound by theory, the activator is believed to assist in the formation of activated oxidizing species, such as activated peroxy radicals, at reaction sites on the abrasive.

Preferably, the activator is substantially insoluble in the composition such that it remains for the most part associated with the surface of the abrasive particle during the CMP process. Of course, with the advent of nanotechnology and with polymeric particles, it is recognized that the distinction between "soluble" activator and activator associated with the surface of a particle will become blurred. Particles with a size below one nanometer are envisioned in this process, but some may call a sub-nanometer particle "solubilized". One distinction is that applicator associated with a particle can usually be physically separated from the fluid. Another distinction is that the activator is associated with a group of molecules that at least partially hinder the activator or a portion thereof from the surface such that metal contamination is not an issue. A third distinction is that the activator is not simply part of a single molecule. Of course, not all, but rather any one of these conditions is sufficient to meet the criteria for being associated with a particle.

Advantages of having the activator be associated with the particles include 1) that metal ion contamination of the substrate is prevented; 2) that the activator ions do not simply act as promoters shuffling electrons from the other oxidizer to the substrate; 3) that the free radicals are formed in-situ and very close to the point of use; 4) the activator-containing particles can be readily recovered and re-used; 5) that the fluids do not have troublesome metal ion contaminants; 6) that the pot life of a slurry is long, and can be as long as several days without significant (10%) loss of oxidizers; 7) that the activators can change the zeta potential of the particles, altering the colloidal properties; 8) that the amount of activator contacting the slurry can be highly controlled. Any of the activator/"particle combinations that meets a plurality of these conditions, and is still active, can be called "associated with the surface of a particle" rather than "dissolved".

The activator in these embodiments is associated with a surface of a particle. The term "associated" means the activator is absorbed, adsorbed, coated to, or in any way bound to the surface of the surface if the particle. In a less preferred embodiment, the activator may be partially or fully doped into the particle or abrasive or into a portion of the particle or abrasive. The doped portions may be treated to expose the activator and make it active. Generally, however, metal oxides that are a part of a crystalline or semi-crystalline matrix structure, as opposed to being disposed on the surface of such a (semi)crystalline structure, are not as able to readily change oxidation states and are not as able to be contacted as readily by the compounds that produce free radicals, both of which are required to have the activators activate the compound that produces free radicals.

In most preferred embodiments, the activator is associates with the outer surface area and with the area just inside pores opening directly to the outside of the particle, which surface area is called here the outer or outside surface area. In addition to being easier to place selected activators on this surface, the free radicals generated by the interaction of the activator and the compounds that produce free radicals can easily move from the outer surface area of the abrasive and immediately contact the substrate. In most embodiments of this invention, therefore, the activator is associated with some or all of this outside surface area.

There are many meanings for the term "surface area". There is the "outside surface area", which is about equal to pi times the particle size D. This is the only surface area of many ceramic particles, as the porosity of those particles can be insignificant.

However, the very high surface area alumina and silica particles may also have surface area that is less accessible to fluids, compounds producing free radicals, and the like. Additionally, free radicals produced in some inside pores may cease to exist before the free radicals escape the particle pore structure. Generally, when describing a particle, the surface area is that measured by any of a number of techniques, such as BET or gas absorption. This provides a "total surface area" of for example 200 square meters per gram with a particle size of for example 0.1 microns. The activator can cover substantially all or only a very small fraction of this total surface area.

While activator may beneficially be associated with this total surface area, the activator near the center of the particle will be less effective on a weight basis than activator associated with the outside surface. We therefore define a surface area which is about pi times D plus about 10% to about 30%, say about 15%, of the remaining surface area as "connected surface area". For larger particles, i.e., greater than 0.8 microns, this percentage is smaller, and for very small particles, i.e., particles smaller than 0.2 microns, this percentage gets larger. This is an arbitrary value and is intended to be the surface area of the pore structure "near" the outside surface, where the term near is arbitrarily chosen. For large particles with large surface areas, i.e., 1 micron particles with a surface area of about 100 square meters per gram, the outside surface area can be very small compared to the "connected surface area. One advantage of this interior-surface-located activator is that if the activator particles are re-used, the abrasive will still have activity even if the outer surface of the abrasive particle is to some extent worn away.

The amount of activator on a particle can be very small, covering for example between less than 0.01% to greater than 90% of any of the total surface area, the connected surface area, or the outer surface area. Generally, less than 100% coverage can be beneficial, because the reaction that produces free radicals, which is usually exothermic, can go so fast that the required control necessary for flat planarization can be lost. The activator in one embodiment is associated with and covers between about 0.0001% to about 100% of the available surface area of the abrasive or particle or polishing pad.

Yet the amount of activator, on a weight basis, on a particle can be very small. A layer that is between one and a few hundred atoms thick can be effective, and a thinner layer has a lower tendency to lose activator to the solution. The amount of activator on a particle can range from about 0.0001% by weight of the particle to about 60% by weight of the particle. In larger particles, the amount of activator is beneficially toward the lower end of the range, while in very small particles the activator may form a significant portion of the activator. Generally, for silica with a size of about 0.4 microns, the amount of activator on a particle will range from about 0.01% to about 2%, for example between about 0.1% and about 1%.

For those instances where crystals of activator are used, the amount of activator in the crystal can of course approach 100%.

The tenacity of the activator to the particle is important, because metallic activator that leaves the particle and becomes dissolved can plate onto the substrate, or can become associated with the substrate so that it merely acts as a promoter shuttling electrons from the oxidizer to the substrate. Therefore, dissolved metal-containing activator is usually a contaminant. Further, it often degrades oxidizers. A slurry should have most, i.e., more than 50%, preferably more than 90%, more preferably more than 99%, of the activator associated with a solid (pad, material, or particle) compared to the total "activator species including that associated with a solid and that dissolved. For example, a prepared slurry had about 200 ppm total iron when calculated based on the weight of the slurry, where less than 1 ppm was in solution and the rest was absorbed on the abrasive.

Various methods can be used to reduce the amount of activator dissolved in a slurry. Pretreating the metal oxides, primarily silica, with agents to obtain OH groups can be beneficial. Post treating the activator-containing particles with various dispersants, passivating agents, and the like can reduce activator leaching.

The activator layer can be made very thin, approaching a monolayer, so that each activator atom is bound by a plurality of OH groups from the silica. Additionally or alternatively, particles containing activator associated therewith can be soaked or washed in a variety of acids, oxidizers, optionally bases, and chelators to remove from the particle that portion of the activator that is less firmly bound, insofar as a sufficient amount of activator remains for the desired activity.

The activator activity is a function of the particle characteristics (which increases if the activator is available to the compounds that form free radicals and is able to readily change oxidation states), the amount of activator on a particle, and the activity of the activator(s) selected relative to the compound that produces free radicals, the concentration of the compound that produces free radicals, and the amount of activator-containing particles in a slurry.

It should be noted that merely adding a transition metal salt and a surface, for example a abrasive, together in a slurry will not give activator that is associated with surface. Ion repulsion and other forces keep the slurry from absorbing or adsorbing onto the surface well.

Any or all of the particles in a slurry can have activator associated therewith. The same abrasive can be used, wherein a portion of the abrasive has activator associated thereon and a portion of the abrasive is activator-free. Alternatively, a mixture of one or more abrasives can be used, where one type of abrasive has activator and another type is activator-free. In some embodiments the activator can be on smaller particles than the abrasive. For example, silica is a preferred abrasive for being a carrier of activator associated with the surface thereof, because silica holds the activator atoms tenaciously while at the same time allowing free radical formation to proceed, especially by a Fenton-type process where the activator changes oxidation states. However, some metals may exhibit better polishing with a different abrasive, for example alumina or ceria. A slurry may be made where activator-containing silica is admixed in a slurry with non-activator alumina or ceria. There is an unlimited number of combinations that one skilled in the art, with the benefit of this disclosure, will be able to devise.

In one embodiment abrasive metal oxide particles having at least about 25% of the outside area with activator associated therewith, is used in an amount of between 0.1 and 1% by weight of the activator-containing abrasive of the slurry. Abrasive that does not contain activator makes up the remainder, say up to about 5% as an example by weight of this pure abrasive by weight in the slurry. One problem with this is that the different zeta potentials of pure abrasive versus abrasive that has activator associated therewith can result in for example uneven settling of the particles in a stagnant slurry, and therefore gradients in compositions after even relatively short term interruptions. The particles can of course be treated as is known in the art to remain in solution.

However, if all 5.1% to 6% of the abrasive particles in the above-mentioned case have activator thereon, but the amount of activator is much smaller than the 25% coating on the particles in the above case, say maybe only covering 5% of the surface of every particle, then all particles will behave similarly in solution and there will be less a tendency to have problems associated with short term interruptions in polishing. At the same time, the activator activity level in the slurry can be preserved.

All or a portion of particles may be polymeric.

Additives Associated with Particles

A polymer, for example ionomer, a polycarboxylic acid, a fatty amine, and the like can be treated onto a metal oxide abrasive, for example onto the aluminum and/or silica.

In some embodiments abrasives containing activator associated on the surface thereof can be encapsulated by a polymeric material, or can be substantially encapsulated by compounds bound to the surface. Such materials should be removable or should be made ineffective on polishing, so that activator can contact the fluid. The amount of plastic/polymer/ionomer can be as little as to fill about between about 5 to about 20% of the porosity of the particles.

Abrasive with activators at greater than 1% coating may be advantageous.

Alternatively, other metals and compounds added to the abrasive particles may be useful. A coating that is only partially activator, where the remainder is an inert or substantially inert metal (i.e., a promoter that is not an activator, for example a tin compound) may be useful to coating but "space" the activator active sites.

Silanes bound to the surface of abrasives may be useful, altering the surface of the abrasive, i.e., silica.

Slurry

In one embodiment of this invention the CMP system comprises a slurry having a compound that forms free radicals and an activator associated with particles suspended within the slurry, i.e., an abrasive with a available activator attached on a surface of the abrasive where the attached activator is contactable by the fluid.

Generally, throughout this description, any mention of a component of the slurry, also called composition, refers to at least one such component, for example, one such component or multiple such components. Further, any amount of a component of the composition is given as a weight percent (wt. %) relative to the composition. Additionally, any amount of a component is given as an approximate amount, for example, more or less than, or equal to, the precise numerical amount stated. This convention concerning approximate amounts applies to any numerical measure stated herein in connection with the composition, such as a numerical pH level stated for the composition or a numerical process parameter stated for a CMP process employing the composition. The foregoing conventions apply throughout this specification unless specified or clearly intended or implied otherwise.

The composition generally comprises at least one oxidizing agent and at least one abrasive that is at least partially coated by a activator, as further described herein. Typically, the abrasive component comprises a portion of abrasive that coated with activator (sometimes referred to herein as "coated activator") and a portion of abrasive that is not coated with activator (sometimes referred to herein as "normal abrasive"), although only the former need be present. For example, the abrasive may comprise a ratio of coated abrasive to normal abrasive of about 1 to about 9. Each of the components of the composition and typical, preferred, and more preferred amounts thereof, in approximate weight percent (wt. %) relative to the composition, are provided below in Table 1.

TABLE 1

Chemical Mechanical Polishing Composition

| Component | Typical Amount | Preferred Amount | More Preferred Amount |
| --- | --- | --- | --- |
| Oxidizing Agent | 0.01 to 30 wt. % | 0.01 to 10 wt. % | 0.01 to 6 wt. % |
| Normal Abrasive | 0.01 to 30 wt. % | 0.01 to 20 wt. % | 0.01 to 10 wt. % |
| Coated Abrasive | 0.01 to 50 wt. % | 0.01 to 20 wt. % | 0.01 to 10 wt. % |

In addition to the oxidizing agent component, the composition also comprises an abrasive that is at least partially coated by a activator. The abrasive is effective in the mechanical removal of targeted material on the substrate surface. Suitable amounts of activator coated abrasive, such as the preferred range of from about 0.01 to about 20 weight percent relative to the composition, are listed in Table 1 above. Suitable amounts of normal abrasive, if any, are also listed in Table 1.

It is generally preferred to use the activators at a pH between about 1.5 and about 9, more preferably between pH of 2 and 8. Fenton's reaction type formation of free radicals has historically been limited to between pH of about 3 and 6, and this is a preferred pH range for most activator/compound that produces free radicals combinations of this invention. However, the association of the activator to a surface, particularly to a metal oxide (hydroxide) surface, has allowed the pH range for Fenton's reaction to be surprisingly extended into the basic pH range (7 and above). Too high a pH, depending on the materials used, will degrade the effectiveness of most activator/compound that produces free radical combinations. For this reason a mild buffer can advantageously be incorporated into the slurry. Any buffer will work, including organic acids and salts thereof, inorganic acids and salts, or mixtures or combinations thereof. Several organic acids are free radical quenchers, and this should be accounted for in determining activator activity.

The user must take care of the conditions under which the polishing takes place. Free radical formation is often temperature dependent, and optimum results are often found at between about 40 and about 60 degrees Centigrade.

Not all of the abrasive particles or other particles need be coated with activator.

Less activator is better. The amount of activator in a slurry, wherein the activator is expressed as weight of the metal ion in the slurry, can be between about 5 to 5000 ppm total activator, preferably about 10 to about 1000 ppm total activator, more preferably about 20 to about 200 ppm total activator. Low amounts of activator, between about 5 ppm and about 40 ppm, for example between about 10 and about 30 ppm, have been found to be effective.

For iron activator with hydrogen peroxide, the amount of activator iron is preferably less than 0.008% by weight in a slurry. For iron activator with ammonium persulfate, the amount of activator iron is preferably less than 0.08% in a slurry.

Polishing Pad

Activators can be associated with for example a polishing pad. Polishing pads are described for example in U.S. Pat. Nos. 6,435,947 and 6,383,065, the disclosures of which are incorporated herein by reference. The polishing pad are generally of a polymeric material. The polishing pads of the current invention can be any polishing pad, circular or belt or vibrational, wherein the pad comprises an activator that is substantially bound and insoluble in the fluid. In one embodiment the activator is associated with the polymeric surface. Alternatively or additionally, the activator may be associated with particles, for example abrasives, on the surface of the polymeric material. Of course, like polymeric particles, the pads may wear. Therefore, it is advantageous to incorporate the activator in the matrix of the pad such that a substantially constant activator "activity", that is, generation of free radicals, can be maintained as the pad wears.

Polishing pads are generally a porous polyurethane. The incorporation of abrasive particles into polishing pads is disclosed in several U.S. Pat. Nos. 5,849,051 and 5,849,052, the disclosures of which are incorporated herein by reference. In addition, solid metal materials have been incorporated into polishing pads as described in U.S. Pat. No. 5,948,697, and the materials increase semiconductor polishing upon application of an electrical bias to the semiconductor. Polishing pads including a polishing pad substrate and a metal-containing soluble catalyst having multiple oxidation states (an oxidizer) for use in conjunction with an oxidizing agent to chemically mechanically polish metal features associated with integrated circuits is described in U.S. Pat. No. 6,383,065, the disclosure of which is incorporated herein by reference.

U.S. Pat. No. 6,435,947, the disclosure of which is incorporated herein by reference, describes a pad having a solid heterogenous catalyst which may be an activator, the polishing pad being useful to remove metal layers from a substrate. The patent teaches that the activator-like material can be an oxide of Ti, Ta, W, V, Nb, Zr, and mixtures thereof. The only catalyst taught, however, was $TiO_2$ and/or $TiO_3$. The term "heterogeneous solid catalyst" is defined as solid catalyst which is distinct from the liquid phase and not significantly soluble in the chemical mechanical composition liquid phase. The patent taught that this catalyst needed actinic radiation, and that the polishing pad is exposed to light in the UV range.

The activator containing polishing pads of this invention include a polishing pad substrate and at least one activator, wherein the activator is associated with the surface of the pad. The activator is substantially insoluble, and is coated on, absorbed, and/or absorbed onto the surface of the pad. The preferred pad-based activators are absorbed, adsorbed, coated, or otherwise bound transition metals that can act as activators without the addition of actinic energy (such as is required by for example titanium oxides)

Activator may be incorporated into a polishing pad substrate by any method known in the art for incorporating a material into or onto a polymeric substrate. Examples of methods for incorporating the activator into a polishing pad substrate include encapsulation, impregnation, creating a polymer/activator complex, incorporating the activator as a small molecule into the polishing pad substrate polymer matrix, or any combinations of these methods.

The polishing pad substrate may be any type of polishing pad substrate that are useful for CMP, for example the hard pad IC 1000 on SUBA IV (TM, Rodel). Typical polishing pad substrates available for polishing applications, such as CMP, are manufactured using both soft and/or rigid materials and may be divided into at least four groups: (1) polymer-impregnated fabrics; (2) microporous films; (3) cellular polymer foams and (4) porous sintered-substrates. For example, a pad substrate containing a polyurethane resin impregnated into a polyester non-woven fabric is illustrative of the first group. Polishing pad substrates of the second group consist of microporous urethane films coated onto a base material which is often an impregnated fabric of the first group. These porous films are composed of a series of vertically oriented closed end cylindrical pores. Polishing pad substrates of the third group are closed cell polymer foams having a bulk porosity which is randomly and uniformly distributed in all three dimensions. Polishing pad substrates of the fourth group are opened-celled, porous substrates having sintered particles of synthetic resin. Representative examples of polishing pad substrates useful in the present invention, are described in U.S. Pat. Nos. 4,728,552, 4,841,680, 4,927,432, 4,954,141, 5,020,283, 5,197,999, 5,212,910, 5,297,364, 5,394,655, 5,489,233 and 6,062,968, each of the disclosures of which are incorporated herein by reference.

The preferred embodiment is the incorporation of molecules and/or layers of activator chemically or physically bound to the pad material. The layer of activator, rather than dissolving, contacts the fluid containing the compound that produces free radicals to produce free radicals.

In another embodiment the activator is associated with abrasive particles contained within the pad. For example, very small, for example 1 to 10 nanometer sized particles, can be embedded into the structure of a polishing pad. With the advent of nanotechnology, subnanometer particles of fairly similar size can even be manufactured. These abrasive can function as abrasives in the slurry function, and can have activator associated thereon.

The polishing pad substrates used in the present invention may be any one of the substrates described above. In addition, the polishing pad substrate may be made from a material other than a polymer such as cellulose fabric or any other materials that are known in the art to be useful for chemical mechanical polishing. What is important is that the polishing substrate chosen must be capable of being combined with at least one activator to form a activator containing polishing pad.

Additional features, aspects and advantages of the present invention will become apparent from the description of preferred embodiments and the various methods and examples set forth below.

Method

The compositions and systems of the present invention are usefully employed in the chemical-mechanical polishing (CMP) of a substrate.

In a typical chemical mechanical polishing process, the substrate is placed in direct contact with a rotating polishing pad. A carrier applies pressure against the backside of the substrate. During the polishing process, the pad and table are rotated while a downward force is maintained against the substrate back. An abrasive and chemically reactive solution, commonly referred to as a "slurry" is deposited onto the pad during polishing. Polishing without an abrasive is also possible using selected compositions of this invention. The slurry initiates the polishing process by chemically reacting with the film being polished. The polishing process is facilitated by the rotational movement of the pad relative to the substrate as slurry is provided to the wafer/pad interface. Polishing is continued in this manner until the desired film on the insulator is removed.

In its basic components, a method for polishing a substrate including at least one metal layer comprising the steps of:

(a) admixing the CMP fluid of this invention, the fluid containing a compound that produces free radicals;

(b) contacting the fluid with an activator to form free radicals in the fluid;

(c) contacting the free radical-containing fluid to the substrate; and (d) mechanically abrading the substrate contacting the free radical-containing fluid to the substrate, thereby removing at least a portion of the metal layer from the substrate.

The slurry composition is an important factor in the CMP step. Depending on the choice of the oxidizing agent, the abrasive, and other useful additives, the polishing slurry can be tailored to provide effective polishing to metal layers at desired polishing rates while minimizing surface imperfections, defects, corrosion, and erosion. Furthermore, the polishing slurry may be used to provide controlled polishing selectivities to other thin-film materials used in current integrated circuit technology such as titanium, titanium nitride and the like.

The compositions of this invention provides very desirable material rates, for example, up to 15,000 Angstroms (A) per minute using concentrations normally found in CMP slurries, in a CMP process. Generally, a rate of between about 4000 and about 8000 A/m is preferred for better control. It may be desirable to adjust the composition or the CMP process to bring the rate down to a level suitable for certain applications, such as the CMP of very thin films, for example, a copper film of about 3000 A in thickness. For copper, a preferred slurry has between 1% and 7%, say between 3% and 5%, of hydroxylamine at a pH of between 6 and 7, say about pH 6.7.

The composition is effective when used in conventional CMP processes, as well as CMP processes having relatively low carrier pressures. Substrates polished using the composition show good uniformity values, as reflected by relatively low within wafer nonuniformity percentages. For example, in one example provided herein, the within wafer nonuniformity of the polished substrate was about 4.57 percent.

Care should be taken as to the amount of activator-coated abrasive used, as using too much activator may compromise control of the CMP process. The amount of activator-coated abrasive should generally not exceed 50 weight percent of the composition. Where activator concentration is a concern, an increased amount of normal abrasive, absent a activator coating, may be used to dilute the activator in the composition and facilitate control of the CMP process.

In one embodiment of this invention particles having associated activator are recovered from used CMP slurries after polishing and are re-used. The activator is not used up in the process. A simple expedient of separating particles having activator thereon, which may or may not also contain a small amount of the used fluid, can be revovered from the slurry by for example filtration, centrifugation, or the like. Various additives such as salts can be added to destabilize the slurry to enhance separation, but such material should subsequently be washed, for example with a dilute mineral acid, prior to reuse.

Such a system would have an additional amount of activator-coated particles added thereto to replace that lost to for example grinding. A small fraction of the recycled activator-coated particles may be disposed of to keep the amount of activator-coated particles in the CMP slurry constant.

If activator coated particles have different zeta potentials in the slurry than non-activator coated abrasive, separation may be done by partially destabilizing the slurry and recovering the particles having activator associated thereon.

In another embodiment, if actinic energy is needed for an activator to perform, or if actinic energy is itself the activator, it is beneficial to expose the free radical-containing fluid to the activator immediately prior to placing the fluid between the pad and the substrate. If an activator is used, it may be in the form of a mesh where actinic radiation can be easily applied in the desired amounts. If the activator is actinic radiation, then this radiation is also beneficially applied to the incoming fluid immediately before the fluid enters the system and passes between the substrate and the pad. Chambers to photoactively promote a reaction, and actinic radiation sources such as mercury lamps, are well known.

In another embodiment, the temperature of the slurry is controlled to an average temperature of between about 30 degrees and 60 degrees Centigrade, but where the temperature variation is less than about 3 degrees centigrade. Free radical formation is very temperature dependent, and the etch rate can be varied by for example changing the temperature.

In some embodiments the temperature can be changed during a CMP process, following a profile to give increased free radicals in the initial polishing and less free radicals in the later stage of polishing. Similarly, the amount of formation of free radicals can be changed by altering the pH of the solution. Other combinations will be devised by one of ordinary skill in the art with the benefit of this disclosure.

Additionally, magnetism and electric field potentials, as described for example in U.S. Pat. No. 6,030,425 may be useful, but are not preferred as they unduly complicate the CMP equipment.

As mentioned above, the abrasive material of the composition is at least partially coated with the activator. As used herein, "coating" and its various linguistic or grammatical forms or counterparts generally refer to forming a physical connection between the abrasive and the activator, such as by forming at least a partial layer of activator material on at least a portion of the abrasive, absorbing or adsorbing the activator material on at least a portion of the abrasive, forming adhesion between the activator material and at least a portion of the abrasive, and the like, by any suitable means or method.

By way of example, a method of producing a silica sol coated with iron acetate is provided in U.S. Pat. No. 4,478,742 of Payne, the entire contents of which are incorporated herein by this reference. Similarly, U.S. Pat. Nos. 3,007,878, 3,139,406 and 3,252,917, which describe ways of putting metals on a core of silica, are incorporated herein by this reference. The activator may coat from about 0.001% to about 100%, for example about 5 to about 100 percent of the surface of the abrasive particle, such as from about 5 to about 80 percent of the particle surface, or preferably, from about 25 to about 50 percent of the particle surface.

In one embodiment, activator is put on to substantially all the outer surface or all the connected surface, and then activator is removed by for example washing in heated acids, oxidizers, and/or chelators to obtain a desired coating, for example between about 1% and about 25% of surface area coated. The remaining activator will be very tenaciously bound to the surface, reducing activator loss due to leaching to the solution.

The CMP composition or slurry of the present invention may be prepared using conventional techniques. Typically, the water, additives, and abrasive components are combined, activator-coated abrasive is then added, oxidizer is then added, and the pH is adjusted.

Alternatively, according to one aspect of the present invention, the activator-coated abrasive may be added to an existing CMP composition, such as a commercially available CMP composition that contains an oxidizing agent. For example, the activator-coated abrasive may be added to a previously formulated peroxide composition to provide a CMP composition of this invention.

In some CMP processes, particularly some of the advanced polishing processes, the composition is prepared by adjusting the amount of each composition component in real time, just prior to a re-mixing of the composition at the point of use. For most CMP processes, the prepared composition is re-mixed at the point of use, whereupon it is poured onto the polishing pad. Typically, the composition is poured onto the pad as it is moved or rotated. As the CMP process proceeds, additional slurry may be added or excess slurry may be removed, as desired or necessary.

EXAMPLES

Examples of the composition according to the present invention are provided below. The abrasive used was Mirasol 3070™, hereafter Mirasol, a commercially available aqueous solution of abrasive silica particles. Mirasol, commercially available from Precision Colloids, LLC of Cartersville, Ga., contains approximately 30 weight percent silica ($SiO_2$) particles, which generally have an effective diameter of approximately 70 nanometers. Mirasol 3070 coated with activator contains the above-described Mirasol with for example iron acetate activator coated/absorbed onto at least a portion of the surface of the silica particles, i.e., on about 70 percent of the surface area of each silica particle. Mirasol having as an activator, i.e., cationic iron is hereafter Mirasol/Fe—Ac, or copper which is hereafter Mirasol/Cu—Ac, provided the activator. Generally, the compounds that form free radicals include hydrogen peroxide ($H_2O_2$), persulfate, and/or peracetic acid. Unless otherwise specified, water formed the balance of the slurries.

A first example concerns two CMP compositions, Example A and Example B, both at pH 2, which are particularly suited to CMP of a wafer, such as a silicon wafer, having a tungsten layer or feature on its surface. The components of the two compositions and the approximate amounts thereof, as well as the approximate pH of the compositions, are set forth in Table 2.

TABLE 2

| CMP Example A and Example B | | | | |
|---|---|---|---|---|
| | $H_2O_2$ | Peracetic Acid | Mirasol | Mirasol w/Fe—Ac |
| Example A | 3 wt. % | 0 wt. % | 5 wt. % | 0.5 wt. % |
| Example B | 0 wt. % | 5 wt. % | 5 wt. % | 0.5 wt. % |

In Example A, hydrogen peroxide served as an oxidizing agent, Mirasol 3070 and Mirasol 3070 with a cationic iron activator absorbed onto at least a portion of the surface of the silica particles served as an abrasive and abrasive coated with a activator, respectively, and deionized water made up the remainder of the composition. Example B differed from Composition A in that peracetic acid ($CH_3COOOH$), rather than hydrogen peroxide, served as an oxidizing agent. For both Example A and Example B, the Mirasol 3070 component was believed to be predominantly responsible for determining the pH of the composition.

Each of the Example A and B were used in a conventional CMP process performed on a silicon substrate at least partially layered with a tungsten film of about 8000 Angstroms (A) in thickness. The process parameters for both included a carrier pressure of about 6 pounds per square inch (psi), a carrier speed of about 90 revolutions per minute (rpm), a platen speed of about 90 rpm, and a flow rate for the CMP composition used of about 175 milliliters per minute (ml/min). The processes differed only in terms of which CMP composition was used. The results of each CMP process in terms of the approximate material (tungsten) removal rate in Angstroms per minute (A/mm) and the approximate within-wafer nonuniformity percentage (% WIWNU) are set forth in Table 3.

TABLE 3

| CMP Results on Tungsten Using Example A or Example B | | |
|---|---|---|
| | Removal Rate (A/mm) | Nonuniformity (% WIWNU) |
| Example A | 5040 | 10.9 |
| Example B | 5077 | 7.42 |

As mentioned previously, in CMP processes, and particularly modern or advanced CMP processes, it is desirable to obtain acceptable or optimal, such as increased, material removal rates while using acceptable or optimal, such as not unduly high, carrier pressures. In the CMP of tungsten-layered wafers, a good carrier pressure is about 9 psi or less, such as about 6 psi, and a good outcome at a pressure of about 6 psi is a removal rate of greater than about 5000 A/mm. Further, obtaining polished wafers with uniformity values of from about 3 to about 12% WLWNIJ percent is considered a good result. While the foregoing examples of process parameters, outcomes and results are often desirable, other suitable outcomes and results are contemplated herein.

In the CMP processes performed with Example A and Example B, desirable tungsten removal rates of about 5040 and 5077 A/mm, respectively, were obtained. Additionally, the surfaces of the polished wafers were substantially uniform, having 10.9 and 7.42% WIWNU, respectively. Example B is generally preferred over Example A, given its higher removal rate and better uniformity value (lower % WIWNU). It should be noted that while there is a general preference for compositions that provide high removal rates, other factors, such as good uniformity values (for example, low % WIWNU), efficient use of oxidizer, and good storage and handling characteristics, are also important considerations in the evaluation of a composition of the present invention.

A second example of the composition of the present invention concerns two CMP compositions, Example C and Example D, which were used in the CMP of a silicon wafer that had a copper layer or feature on its surface. In this example, the copper layer had a thickness of about 15,000 A. One oxidizer was hydroxylamine (HDA®, EKC Technology, Inc.). The components of the two compositions and the approximate amounts thereof, as well as the approximate pH of the compositions, are set forth in Table 4.

TABLE 4

CMP Example C and Example D

| | HDA® | Peracetic Acid | Mirasol | Mirasol w/Fe—Ac | pH |
| --- | --- | --- | --- | --- | --- |
| Example C | 0 wt. % | 1.5 wt. % | 5 wt. % | 0.5 wt. % | 2 |
| Example D | 4 wt. % | 0 wt. % | 5 wt. % | 0.5 wt. % | 6.7 |

The two compositions also differed in terms of pH, Composition C having a pH of about 2 and Composition D having a pH of about 6.7.

Each of the Examples C and D were used in a conventional CMP process performed on a silicon wafer at least partially layered with copper. When Example C was used, the process parameters included a carrier pressure of about 4 psi, a carrier speed of about 40 rpm, a platen speed of about 40 rpm, and a flow rate for the Example C of about 100 ml/min. When Example D was used, the process parameters included a carrier pressure of about 4 psi, a carrier speed of about 75 rpm, a platen speed of about 75 rpm, and a flow rate for the Example D of about 175 ml/mm. The parameters of each CMP process are set forth in Table 5 and the results thereof in terms of the approximate material (copper) removal rate and the approximate within-wafer nonuniformity percentage are set forth in Table 6.

TABLE 5

CMP Process Using Example C or Example D

| | Carrier Pressure (psi) | Carrier Speed (rpm) | Platen Speed (rpm) | Flow Rate (ml/min) |
| --- | --- | --- | --- | --- |
| Example C | 4 | 40 | 40 | 100 |
| Example D | 4 | 75 | 75 | 175 |

TABLE 6

CMP Results on Copper Using Example C or Example D

| | Removal Rate (A/mm) | Nonuniformity (% WIWNU) |
| --- | --- | --- |
| Example C | ~15,000 | Not measurable |
| Example D | 7800 | 8.87 |

As mentioned previously, in CMP processes, and particularly modern or advanced CMI processes, it is desirable to obtain acceptable or optimal, such as increased, material removal rates while using acceptable or optimal, such as not unduly high, carrier pressures. In the CMP of copper-layered wafers, a good carrier pressure is about 9 psi or less, such as about 4 psi, and a good outcome at a pressure of about 4 psi is a removal rate of greater than about 7500 A/mm. While the foregoing examples of process parameters, outcomes and results are often desirable, other suitable outcomes and results are contemplated herein.

In the CMP process performed with Example C, an unusually high copper removal rate was obtained, such that all of the copper was removed. This result prevented measurement of a uniformity value. In the CMP process performed with Example D, a desirable copper removal rate was obtained. Additionally, the surface of the wafer polished using Example D was substantially uniform. Example D is thus a desirable composition of the present invention.

Example C, with only 1.5% peracetic acid, is also a useful composition of the present invention, although it may be a bit too aggressive in terms of removal rate for some applications such as the polishing of very thin layers of copper on a substrate. Accordingly, for some applications, a CMP process using Example C may be altered by diluting the composition, diluting the activator-coated abrasive and/or oxidizing agent components of the composition, changing the composition flow rate, or the like. this suggests that oxidizer concentrations well below 1% may be useful. Too low a concentration, on the other hand, can create problems of non-uniformity due to minor interuptions, especially if the slurry is not stable. It is generally preferred to keep the compound that forms free radicals, here the peracetic acid, at a concentration above 0.5%.

A third example concerns two CMP compositions of the present invention, Example B, from the first example above, and Example E, each of which were used in the CMP of a silicon wafer that had a tungsten layer on its surface, the layer being of about 8000 A in thickness. Example B was compared to a similar comparative example, Example 1, and Example E was compared to a similar comparative example, Example 2. Neither of comparative examples 1 and 2 contained activator-coated abrasive. The pH of all four compositions was about 2. The components of the four compositions and the approximate amounts thereof are set forth in Table 7 below.

Example E and comparative example 2 contained ethylene glycol, the purpose of which was to boost the removal rate.

TABLE 7

CMP Examples B and E and Comparative Examples 1 and 2

|  | H₂O₂ | Peracetic Acid | Mirasol | Mirasol/ Fe—Ac | Ethylene Glycol |
|---|---|---|---|---|---|
| Example B | 0 wt. % | 5 wt. % | 5 wt. % | 0.5 wt. % | 0 wt. % |
| Comp. Ex. 1 | 0 wt. % | 5 wt. % | 5 wt. % | 0 wt. % | 0 wt. % |
| Example E | 3 wt. % | 0 wt. % | 5 wt. % | 0.5 wt. % | 0.25 wt. % |
| Comp. Ex. 2 | 3 wt. % | 0 wt. % | 5 wt. % | 0 wt. % | 0.25 wt. % |

Each of the four compositions were used in a conventional CMP process having the same process parameters as previously described in the first example and set forth in Table 3 above. Each of Comparative Examples 1 and 2 were tested twice, in a Trail A and a Trial B, respectively. The results of each CMP process in terms of the approximate material (tungsten) removal rate in A/mm and the approximate % WIWNU are set forth in Table 8.

TABLE 8

CMP Results Using Examples B or E or Comparative Examples 1 or 2

|  | Removal Rate (A/mm) | Nonuniformity (% WIWNU) |
|---|---|---|
| Example B | 5077 | 7.42 |
| Comp. Ex. 1, Trial A | 2215 | 6.96 |
| Comp. Ex. 1, Trial B | 2466 | 6.94 |
| Example E | 4476 | 4.57 |
| Comp. Ex. 2, Trial A | 1556 | 3.42 |
| Comp. Ex. 2, Trial B | 1582 | 3.34 |

In terms of the tungsten removal rate, Example B outperformed Comparative Example 1 by over 200 percent (up to about 229%) and Example E outperformed Comparative Example 2 by over 280 percent (up to about 288%). The CMP performances of Example B and Example E are impressive, even when the moderate decreases in surface uniformity are considered. These results demonstrate that the activator-coated abrasive is an effective, if not potent, component in the compositions of this invention.

The minor increases in the Nonuniformity with the activator coated abrasives may in part be due to using a mixture of highly coated abrasive (about 70% of outer surface coated with activator) and a greater amount of abrasive without activator. It is believed that uniform abrasive with activator, where the activator is both present in a small percentage of the surface area and is preferentially substantially evenly spaced, for example in spaces clumps, about the surface will reduce non-uniformity.

Example F used a composition having 0.1% Mirasol with copper activator, 5% peracetic acid, and 5% Mirasol. This composition exhibited superior CMP etch rate over a similar composition without the activator.

Example G used a composition having 0.2% Mirasol with Mn-acetate activator, 5% peracetic acid, and 5% Mirasol. This composition exhibited superior CMP etch rate over a similar composition without the activator.

Example H used a composition having 0.5% Mirasol with Mn-acetate activator, 3% hydrogen peroxide, and 5% Mirasol. This composition exhibited superior CMP etch rate over a similar composition without the activator for tungsten (246 angstroms per minute), TEOS (778 angstroms per minute), and titanium (>2200 angstroms per minute). Manganese is a less effective activator than either iron or copper, but can be useful.

Example I used a composition having 0.1% Mirasol with Fe-acetate activator, 3% 0.1% peracetic acid, and 5% Mirasol. This composition exhibited superior CMP etch rate over a similar composition without the activator for copper, ranging from 2200 to 4700 angstroms per minute at different processing conditions, but the best nonuniformity observed in these tests was 13.7%. Manganese is a less effective activator than either iron or copper, but can be useful.

Example J used a composition having 0.5% Mirasol with Mn-acetate activator, 5% hydrogen peroxide, and 5% Mirasol. This composition exhibited superior CMP etch rate, about 2380 angstroms per minute, over a similar composition without the activator which had etch rates of 270 to 380 angstroms per minute, for copper. Further, those wafers polished without activator had about three times the nonuniformity as those wafers polished with the slurry of this invention, which exhibited nonuniformity between 8.8 and 11.9%.

Example J used mixed oxidizers in a slurry having 5% peracetic acid, 2.5% Mirasol, and 0.5% Mirasol with Fe-Acetate at pH 2. The etch rate through tungsten was 4300 angstroms per minute, and the percent nonuniformity was very low, between 2.7% and 5.6%.

Slurry Stability

The next example shows slurry stability. This effective activator-coated abrasive component functions optimally in commercial settings when it is relatively, if not substantially, stable. Slurry stability is a desirable characteristic in the composition, as it facilitates control of the CMP process. Thus, tests were conducted to determine the relative stability of the activator-coated abrasive used in the composition of the present invention, as compared with that of a soluble promoter of similar chemical composition, in the presence of an oxidizing agent, in two other compositions.

The activator which is attached to a surface, for example to an abrasive, functions differently than a similar component which is a soluble promoter. Further, just adding metal salts to a solution containing abrasives does not attach activator to the abrasive.

In these slurry stability tests, the activator-coated abrasive was Mirasol/Fe-Ac, and an oxidizing agent in the form of hydroxylamine ("HDA"), and had a pH of about 7. The first "free promoter" composition was composed of normal abrasive in the form of silica particles, soluble promoter in the form of iron nitrate, and oxidizing agent in the form of HDA, and had a pH of about 7. The second "free promoter" composition was composed of all of the components of the first "free promoter" composition except for the abrasive component.

The three test compositions were prepared as set forth below. A activator-coated abrasive preparation was obtained by adding an appropriate amount of the activator-coated abrasive to 50 milliliters of water, while a first "free promoter" preparation was obtained by adding the silica particles to 50 ml of water, and then adding an appropriate amount of the iron nitrate to the water-abrasive mixture to give the same iron content in the slurry. The amount of abrasive in the first "free promoter" preparation was similar to the amount of activator-coated abrasive used in the "coated activator" preparation. A second "free promoter" preparation containing only iron nitrate dissolved in 50 ml of water (i.e., no abrasive) was also prepared.

The same designated amount of 50% HDA was added to each of these preparations to obtain the three test compositions. At a pH of over 6, HDA is a good reducing agent, the stability of which is extremely sensitive to trace metals in solution. HDA reacts easily with many soluble transition metal ion promoters, such as cobalt, copper and iron ions, resulting in the reduction of the metal ions by at least one oxidation level and the formation of by-products including nitrogen gas, ammonia ($NH_3$), water, and possibly heat, depending on the concentration of the HDA. A high level of reactivity, or a very fast reaction rate, is a sign of relative instability.

When the HDA component was added to obtain the "activator-coated abrasive" composition, little color change, little or no outgassing, and little or no precipitation were observed. When the first "free promoter" composition containing silica abrasive was formed, an immediate color change (light orange to brown), substantial outgassing, and precipitation were observed. When the second "free promoter" composition containing no abrasive was formed, an even more immediate color change (light orange to very dark brown) and similar outgassing, as compared to the first "free promoter" composition, were observed.

The "activator-coated abrasive" composition was clearly more stable than the two relatively unstable "free promoter" compositions tested. The slurry remained useable, that is, had a CMP rate on tungsten and TEOS of at least about one half of the CMP rate for a freshly prepared formulation, after 24 hours.

The compositions of the present invention are all of the "coated activator" variety, comprising a activator-coated abrasive rather than solely a free, soluble promoter such as iron nitrate. As demonstrated above, this relatively stable, activator-coated abrasive is an extremely effective component of the composition of this invention.

The composition of the present invention is advantageously used in conventional CMP processes, and more particularly, in CMP processes that call for reduced carrier pressures. Generally, carrier pressures of from about 0.5 to about 2 psi are considered low carrier pressures, although this pressure range depends on the particular CMP process under consideration. Low carrier pressures are often desirable because they reduce the risk of wafer damage, such as scratching, delaminating, or destroying of material layers, particularly metal layers, on the wafer surface. When the composition of the present invention is used in a low-carrier-pressure process, desirable material removal rates are obtainable even though the carrier pressure is low. Appropriate use of the composition in CMP processes may reduce the risk of wafer damage and improve wafer yield and performance.

Additionally, the composition of the present invention may be advantageously used in the CMP of wafers layered with relatively fragile films, such as porous films, that have low dielectric constants. At the pressures used in typical CMP processes, these films are particularly vulnerable to delamination, crushing, or other damage. In advanced CMP processes used for these wafers, carrier pressures of about 2 psi are desirable and carrier and platen speeds are about the same as, or often greater than, those used in typical CMP processes. For a wafer layered with a porous material of relatively low dielectric constant, such as from about 1.5 or about 1.7 to about 2.3, and of about 0.1 micron in thickness, a removal rate of greater than about 5000 A/mm is desirable. As demonstrated herein, these removable rates are obtainable when the composition of the present invention is used in CMP, even when the carrier pressure is relatively low. The compositions of the present invention are believed suitable for use in CMP processes having even lower carrier pressures, such as the low carrier pressures described above.

As demonstrated herein, the composition of the present invention may be used in CMP processes to obtain desirable material removal rates and within-wafer nonuniformity values. Merely by way of example, the composition may be used in the CMP of a substrate surface having a feature, layer or film thereon, such as a film of aluminum, copper, titanium, tungsten, an alloy thereof, or any combination thereof. Further by way of example, the composition may be used in the CMP of such a substrate surface, where the film has an adjacent or an underlying feature, layer or film, such as a film of tantalum, tantalum nitride, titanium, titanium nitride, titanium tungsten, tungsten, and any combination thereof.

Accordingly, the present invention includes a method of polishing a substrate surface having at least one feature thereon that comprises a metal, such as metal or metal alloy feature. The substrate undergoing polishing may be any suitable substrate, such as any of the substrates described herein. According to the method of the invention, a composition of the invention is provided and the feature on the substrate surface is polished. The polishing is chemical mechanical polishing, such as that associated with any conventional or known CMP process, any suitable later-developed CMP process, or any CMP process described herein. The polishing process parameters may be any suitable parameters, such as any of the parameters described herein. For example, the carrier pressure applied to the substrate surface, or the feature thereon, may be from about 1 to about 6 psi.

Generally, the polishing of the substrate surface continues until the targeted feature or layer is substantially coplanar with surrounding material, such as an oxide material, on the substrate. For example, the polishing of a metal-featured substrate may continue until any metal excess is sufficiently removed to provide a substantially uniform profile across the substrate surface. By way of example, suitable surface uniformity (typically measured using known wafer profiling techniques) is reflected by within-wafer nonuniformity (WIWNU) values of less than about 12%, and preferably, from about 4% to about 6%, the lower values typically reflecting better process control. Appropriate WIWNU values may vary depending on the characteristics of the CMP process and the substrates undergoing polishing.

The inventive method may be used to remove targeted material, such as metal or metal alloy, from the substrate surface at a rate of from about 100 to about 10,000 or to about 15,000 A/mm. The present method may be used to provide a polished substrate surface of good uniformity, such as a substrate surface having from about zero to about 40 percent, preferably, from about zero to about 12 percent, or more preferably, from about zero to about 10 percent, within-wafer nonuniformity. Further, the present method may be used to provide a polished substrate surface wherein any microscratch on the surface that is associated with the polishing is less than about 20 A. The present invention further encompasses a substrate produced by the inventive method, including any of the substrates described herein, and any of the substrates having any of the qualities, such as desirable uniformity values and surface characteristics, described herein.

Various aspects and features of the present invention have been explained or described in relation to beliefs or theories, although it will be understood that the invention is not bound to any particular belief or theory. Further, although the various aspects and features of the present invention have been described with respect to preferred embodiments and specific examples herein, it will be understood that the

What is claimed is:

1. A composition for chemical-mechanical polishing a semiconductor or memory device substrate, comprising:
   a fluid comprising at least one compound that produces free radicals when contacted with an activator, wherein the fluid pH is between about 1 to about 11; and
   a plurality of particles having a surface and having at least one activator associated with the surface, wherein the at least one activator comprises iron, copper, silver, or combinations thereof, and wherein the activator reacts with the compound to form the free radicals;
   wherein the composition when used in a chemical mechanical polishing process will remove desired metal but will not create defects or nonuniformity such that the substrate can not undergo further fabrication to become a finished operable semiconductor or memory device.

2. A composition for chemical-mechanical polishing a semiconductor or memory device substrate, comprising:
   a fluid comprising at least one compound that produces free radicals when contacted with at least one activator, wherein the fluid comprises less than about 500 ppm of dissolved metal ions having multiple oxidation states and the fluid pH is between about 1 to about 11; and
   a plurality of particles having a surface in contact with the fluid and having at least one activator associated with the surface, wherein the activator associated with the surface is a dissociable salt of a metal and is present in an amount between 5 to 10000 ppm by weight of the composition, and wherein the at least one compound when contacted with at least one activator produces free radicals;
   wherein the composition when used in a chemical mechanical polishing process will remove desired material but will not create defects or nonuniformity such that the substrate can not undergo further fabrication to become a finished operable semiconductor or memory device.

3. A composition for chemical-mechanical polishing a semiconductor or memory device substrate, comprising:
   a fluid comprising at least one oxidizer that produces reactive oxygen-containing free radicals when contacted by an activator; and
   a plurality of particles having a surface and having at least one activator comprising an ion of at least one of iron, copper, manganese, cobalt, cerium, and nickel associated with the surface, wherein the activator(s) associated with the surface is/are present in a total amount ranging from about 5 ppm to about 4000 ppm by weight in the composition,
   wherein the composition when used in a chemical mechanical polishing process will remove the desired material but will not create defects or nonuniformity such that the substrate can not undergo further fabrication to become a finished operable semiconductor or memory device.

4. The composition of claim 3 wherein the at least one oxidizer comprises a per-compound present in the composition in an amount from about 0.01% to about 30% by weight.

5. The composition of claim 4 wherein the per-compound comprises at least one peroxide.

6. The composition of claim 5 wherein the per-compound comprises hydrogen peroxide and is present in the composition in an amount from about 0.0 % to about 10% by weight.

7. The composition of claim 4 wherein the per compound comprises peracetic acid and is present in the composition in an amount from about 0.0 1% to about 10% by weight.

8. The composition of claim 4 wherein the per-compound comprises at least one persulfate.

9. The composition of claim 4 wherein the per-compound comprises at least one perphosphate.

10. The composition of claim 4 wherein the per-compound comprises at least one periodate.

11. The composition of claim 3 wherein the at least one oxidizer comprises at least one hydroxylamine compound present in the composition is from about 0.01% to about 30% by weight.

12. The composition of claim 3 wherein the oxidizer that produces free radicals comprises at least two of a peroxide, a persulfate, a perphosphate, a periodate, perodic acid, ozone, and a hydroxylamine compound, and the total amount present in the composition is from about 0.0 1% to about 30% by weight, and wherein the activator comprises cerium, iron, copper, or mixture thereof, and wherein the fluid contain less than about 100 ppm of dissolved metals having multiple oxidation states.

13. The composition of claim 1 wherein the at least one compound comprises ozone.

14. The composition of claim 3 wherein the activator is an ion of iron present in a total amount ranging from about 5 ppm to about 200 ppm by weight in the composition.

15. The composition of claim 1 wherein the plurality of particles having a surface and having at least one activator associated with the surface comprises a metal oxide abrasive.

16. The composition of claim 15, wherein the metal oxide comprises alumina, silica, ceria, or mixtures thereof, and wherein the activator(s) associated with the surface is/are present in a total amount ranging from about 10 ppm to about 1,000 ppm by weight in the composition.

17. The composition of claim 1 wherein the plurality of particles having a surface and having at least one activator associated with the surface comprises a ceramic particle having an average particle size from about 0.001 to about 1 micron,
   wherein the ceramic particle comprises at least one metallic compound selected from the group consisting of zinc oxide, bismuth oxide, a metallic sulfide, a metallic titanate, a metallic tantalate, a metallic zirconate, a metallic silicate, a metallic germanium oxide, a metallic niobate, a metallic boride, a metallic nitride, a metallic carbide, a metallic telluride, a metallic arsenide, a metallic silicide, a metallic selenide, and mixtures or combinations thereof.

18. The composition of claim 1 wherein the plurality of particles having a surface and having at least one activator associated with the surface comprises alumina.

19. The composition of claim 18, wherein the particles have a BET surface area between about 5 and 430 $m^2/g$ and the weight average particle size is less than about 0.4 microns.

20. The composition of claim 18, wherein the particles have a average particle size from about 0.001 to about 0.2 microns.

21. The composition of claim 3 wherein the plurality of particles having a surface and having at least one activator associated with the surface comprises silica.

22. The composition of claim 21, wherein the particles have a BET surface area between about 5 and 1000 $m^2/g$, an average particle size less than about 1 micron, and a particle size distribution such that at least about 95% by weight of the silica particles have a particle size within about 30% of the weight average particle size.

23. The composition of claim 21, wherein the particles have a average particle size from about 0.002 to about 0.6 microns.

24. The composition of claim 3 wherein the plurality of particles having a surface and having at least one activator associated with the surface comprises fumed silica aggregates.

25. The composition of claim 1 wherein the plurality of particles having a surface and having at least one activator associated with the surface comprises ceria.

26. The composition of claim 1 wherein the plurality of particles comprises germania, spinel, titania, an oxide of tungsten, a nitride of tungsten, zirconia, an oxide of vanadium, or a combination thereof.

27. The composition of claim 1 wherein the plurality of particles having a surface and having at least one activator associated with the surface comprises polymeric particles.

28. The composition of claim 27, wherein the polymeric particles are a composite particle further comprising a metal oxide.

29. The composition of claim 1 wherein the composition further comprises at least one second particle different from the plurality of particles having a surface and having at least one activator associated with the surface.

30. The composition of claim 29, wherein the at least one second particle is an abrasive that has no activator associated with its surface.

31. The composition of claim 1 wherein the at least one compound comprises a first oxidizer, and wherein the composition further comprises a second oxidizer.

32. The composition of claim 1 wherein the composition further comprises at least one stabilizer in an amount sufficient to stabilize the composition.

33. The composition of claim 1 wherein the composition further comprises at least one promoter in an amount between 10 ppm and 5000 ppm.

34. The composition of claim 1 wherein the composition further comprises at least one chelator.

35. The composition of claim 1 wherein the composition further comprises at least one soluble activator.

36. The composition of claim 35, wherein the soluble activator is iodine.

37. The composition of claim 1 wherein the composition further comprises at least one anti-corrosion agent, at least one dispersability agent, or both.

38. The composition of claim 1 wherein the composition further comprises at least one pH adjuster, and wherein the fluid pH is between about 2 to about 8.

39. The composition of claim 38, wherein the pH is between about 3 to about 7.

40. The composition of claim 3, wherein the pH is between about 3.5 to about 4.5.

41. The composition of claim 1 wherein the composition further comprises a polishing enhancement agent different from the at least one compound.

42. The composition of claim 1 wherein the composition further comprises a glycol, glycine, a derivative of glycine, or mixture thereof.

43. The composition of claim 1 wherein the plurality of particles having a surface and having at least one activator associated with the surface comprises a metal oxide particle comprising silica, alumina, ceria, or mixtures or combinations thereof, and wherein the metal oxide particles a particle size distribution such that the one-sigma deviation is no more than about 20% of the average particle size, and wherein the activator comprises copper oxide, iron oxide, or mixture thereof.

44. The composition of claim 3 wherein the plurality of particles having a surface and having at least one activator associated with the surface comprises a metal oxide, a polymer, or both, and wherein the activator associated with the surface comprises a dissociable cerium salt.

45. The composition of claim 1 wherein the plurality of particles having a surface and having at least one activator associated with the surface comprises a metal oxide, a polymer, or both, and wherein the activator associated with the surface comprises a dissociable copper salt.

46. The composition of claim 1 wherein the plurality of particles having a surface and having at least one activator associated with the surface comprises a metal oxide, a polymer, or both, and wherein the activator associated with the surface comprises a dissociable iron salt.

47. The composition of claim 3 wherein the plurality of particles having a surface and having at least one activator associated with the surface comprises a metal oxide, a polymer, or both, and wherein the activator associated with the surface comprises a dissociable manganese salt, a dissociable cobalt salt, a dissociable nickel salt, or mixture thereof.

48. The composition of claim 1 wherein the plurality of particles having a surface and having at least one activator associated with the surface comprises a metal oxide that has been doped with a metal selected from iron or copper.

49. The composition of claim 3 wherein the particles comprise inner surface associated with porosity and also comprise an outer surface, and wherein said activator is associated on from about 5 to about 80 percent of the outer surface of the plurality of particles having a surface and having at least one activator associated with the surface.

50. The composition of claim 49, wherein the activator is associated on from about 25 to about 50 percent of the outer surface of the plurality of particles having a surface and having at least one activator associated with the surface.

51. The composition of claim 1 wherein the amount of activator associated with the surface is from about 0.01% to about 3% by weight of the plurality of particles having at least one activator.

52. The composition of claim 3 wherein the fluid comprises less than about 10 ppm of dissolved metal ions having multiple oxidation states.

53. The composition of claim 52, wherein the fluid comprises less than about 2 ppm of dissolved metal ions having multiple oxidation states.

54. The composition of claim 1 wherein the plurality of particles having a surface and having at least one activator associated with the surface comprises silica, alumina, ceria, or mixtures thereof, wherein the at least one activator associated with the surface comprises iron, wherein the amount of activator iron is from about 0.0 1% to about 3% by weight of the plurality of particles.

55. The composition of claim 54, wherein the fluid comprises less than about 10 ppm of dissolved iron.

56. The composition of claim 3 wherein the plurality of particles having a surface and having at least one activator associated with the surface comprises silica, alumina, ceria, or mixtures thereof, wherein the at least one activator associated with the surface comprises cerium, wherein the amount of activator cerium is from about 0.0 1% t about 3% by weight of the plurality of particles.

57. A composition for chemical-mechanical polishing a semiconductor or memory disk substrate, comprising:
a fluid comprising at least one compound that produces free radicals when contacted by an activator; and an activator in the fluid in an amount sufficient to increase the removal rate of tungsten 10% over the removal rate of the composition without the activator, wherein the activator is selected from: iodine; a cerium salt; or a metalglycine complex, wherein the metal consists essentially of cerium, iron, manganese, cobalt, or mixture thereof;

such that the semiconductor or memory disk substrate is undamaged so the substrate can undergo further fabrication steps.

58. The composition of claim 57, wherein the activator comprises iodine and the compound that produces free radicals is a per compound.

59. The composition of claim 57, wherein the activator comprises cerium in an amount between about 10 ppm and about 1000 ppm.

60. The composition of claim 57, wherein the activator comprises a metal-glycine complex, wherein the metal consists essentially of cerium, iron, manganese, cobalt, or mixture thereof, and wherein the free radical is a hydroxide radical.

61. A method of polishing a substrate surface having at least one feature thereon comprising a metal, which method comprises:
providing the composition of claim 1; and
chemically-mechanically polishing the feature by contacting the feature with the composition,
wherein performing the polishing process will not create defects or nonuniformity such that the substrate can not undergo further fabrication to become a finished operable product.

62. The method of claim 61, wherein the plurality of abrasive articles having a surface in contact with the fluid and having at least one activator associated wit the surface comprises an abrasive present in the composition in an amount from about 0.0 10/ to about 20% by weight, and wherein the at least one compound that produces free radicals comprises at least one oxidizer that produces free radicals present in the composition in an amount between about 0.0 1% to about 30%.

63. The method of claim 62, wherein substrate is a semiconductor, the metal feature comprises aluminum, copper, titanium, tungsten, tantalum, any alloy thereof, any metal nitride thereof, any metal silicon alloy thereof, and any combination thereof.

64. The method of claim 63, wherein the feature is adjacent a material selected from the group consisting of tantalum, tantalum nitride, titanium, titanium nitride, titanium tungsten, tungsten, and any combination thereof, and wherein the metal feature material is different from the material adjacent to it.

65. The method of claim 63, wherein said method is sufficient to provide a chemically-mechanically polished substrate surface having a within-wafer nonuniformity from about zero to about 12 percent.

66. The method of claim 63, wherein said method is sufficient to provide a chemically-mechanically polished semiconductor substrate surface wherein any microscratch thereon produced during the chemical-mechanical polishing is less than about 20 Angstroms in depth.

67. The method of claim 62, wherein substrate is a memory device, the metal feature comprises aluminum, copper, titanium, tungsten, tantalum, nickel, nickel-iron, or any alloy thereof, Sendust, and Cadmium-Zinc-Telluride, and any combination thereof.

68. The method of claim 67, wherein said method is sufficient to provide a chemically-mechanically polished memory device substrate surface wherein any microscratch thereon produced during the chemical-mechanical polishing is less than about 20 Angstroms in depth.

69. The method of claim 62, wherein substrate is a silicon substrate, a gallium arsenide (GaAs) substrate, a thin film transistor-liquid crystal display glass substrate, or a Micro Electro Mechanical Systems structure, wherein said method is sufficient to provide a chemically-mechanically polished substrate surface wherein any microscratch thereon produced during the chemical-mechanical polishing is less than about 20 Angstroms in depth.

70. The method of claim 62, wherein at least one portion of the particles in the composition are recovered from used CMP slurries after polishing and are re-used to polish another substrate surface.

71. The method of claim 70, wherein the at least one portion of the recovered particles are recovered by filtration, centrifugation, or a combination thereof.

72. The method of claim 61, wherein the polishing involves movably contacting the feature or the composition with a polishing pad, wherein said polishing pad has a surface and comprises an activator associated with said polishing pad surface.

73. The method of claim 61, wherein the activator does not require actinic energy and is not exposed to activating actinic energy.

74. A method of polishing a substrate surface having at least one feature thereon comprising a metal, which method comprises:
providing the composition of claim 3, wherein the activator does not require actinic energy; and
chemically mechanically polishing the feature by contacting the feature with the composition, wherein the composition is not exposed to activating actinic energy,
wherein performing the polishing process will not create defects or nonuniformity such that the substrate can not undergo further fabrication to become a finished operable product.

75. The method of claim 74, wherein the activator is a dissociable salt of iron present in an amount between about 5 ppm and about 200 ppm.

76. A method of polishing a substrate surface having at least one feature thereon comprising a metal, which method comprises:
providing the composition of claim 2, ;and
chemically mechanically polishing the feature by contacting the feature with the composition,
wherein performing the polishing process will not create defects or nonuniformity such that the substrate can not undergo further fabrication to become a finished operable product.

77. The method of claim 61, wherein the activator comprises iron ions associated with the surface, and the amount of activator iron is between about 2 ppm to 500 ppm based on the weight of the slurry.

78. The method of claim 61, wherein the activator comprises iron ions associated with the surface, and the amount of activator iron is between about 3 ppm to 100 ppm based on the weight of the slurry.

79. The method of claim 61, wherein the activator comprises iron ions associated with the surface, and the amount of activator iron is between about 4 ppm to 20 ppm based on the weight of the slurry.

80. A method of polishing a substrate surface consisting essentially of:
providing the composition of claim 1 disposed between the substrate surface and a polishing pad, wherein the polishing pad exerts a force toward the substrate surface; and movably contacting the substrate surface with the polishing pad and composition disposed between the polishing pad and the substrate surface.

81. A method of polishing a substrate surface consisting essentially of:
   providing the composition of claim 2 disposed between the substrate surface and a polishing pad, wherein the polishing pad exerts a force toward the substrate surface; and
   movably contacting the substrate surface with the polishing pad and composition disposed between the polishing pad and the substrate surface.

82. A method of polishing a substrate surface consisting essentially of:
   providing the composition of claim 3 disposed between the substrate surface and a polishing pad, wherein the polishing pad exerts a force toward the substrate surface; and
   movably contacting the substrate surface with the polishing pad and composition disposed between the polishing pad and the substrate surface.

83. The composition for chemical-mechanical polishing of claim 1, wherein a plurality of particles having a surface and having at least one activator associated with the surface have been contacted with one or more of acids, chelators, or both, wherein the amount of activator associated with the surface of the particle is less than the amount of activator associated with the surface of the particle prior to said contact with one or more of acids, chelators, or both.

84. The composition for chemical-mechanical polishing of claim 3, wherein a plurality of particles having a surface and having at least one activator associated with the surface have been contacted with one or more of acids, chelators, or both, wherein the amount of activator associated with the surface of the particle is less than the amount of activator associated with the surface of the particle prior to said contact with one or more of acids, chelators, or both.

85. The composition of claim 1 further comprising between 0.001 to about 1 weight percent of a stabilizer selected from vitamin B, vitamin C, and citric acid.

86. The composition of claim 1 further comprising between 0.001 to about 1 weight percent of a stabilizer selected from vitamin B, vitamin C, and citric acid.

* * * * *

UNITED STATES PATENT AND TRADEMARK OFFICE
CERTIFICATE OF CORRECTION

PATENT NO. : 7,029,508 B2
APPLICATION NO. : 10/361822
DATED : April 18, 2006
INVENTOR(S) : Brandon Shane Scott et al.

It is certified that error appears in the above-identified patent and that said Letters Patent is hereby corrected as shown below:

Col. 61, line 66 change "0.0 %" to --0.01 %--.

Col. 64, line 62 "t about" should be --to about--.

Col. 65, line 34 "wit" should be --with--;
line 35 "0.0 10/" should be --0.01%--.

Signed and Sealed this

Seventh Day of November, 2006

JON W. DUDAS
*Director of the United States Patent and Trademark Office*

UNITED STATES PATENT AND TRADEMARK OFFICE
CERTIFICATE OF CORRECTION

PATENT NO.       : 7,029,508 B2
APPLICATION NO.  : 10/361822
DATED            : April 18, 2006
INVENTOR(S)      : Brandon Shane Scott et al.

It is certified that error appears in the above-identified patent and that said Letters Patent is hereby corrected as shown below:

On the title page item (56), under References Cited, U.S. Patent Documents, please insert the following:

| | | |
|---|---|---|
| 3,139,406 | 06/1964 | Mindick et al |
| 3,293,093 | 12/1966 | Jones et al. |
| 4,252,671 | 02/1981 | Smith |
| 4,478,742 | 10/1984 | Payne |
| 4,769,073 | 09/1988 | Tastu et al. |
| 4,959,113 | 07/1989 | Roberts |
| 5,084,071 | 01/1992 | Nenadie et al. |
| 5,225,034 | 07/1993 | Yu et al. |
| 5,234,880 | 08/1993 | Cook et al. |
| 5,527,423 | 06/1996 | Neville et al. |
| 5,340,370 | 08/1994 | Cadien et al. |
| 5,354,490 | 09/1994 | Finnigan |
| 5,445,996 | 08/1995 | Kodera et al. |
| 5,735,963 | 04/1998 | Obeng |
| 5,773,364 | 06/1998 | Farkas et al. |
| 5,783,489 | 07/1998 | Kaufman et al. |
| 5,785,868 | 07/1998 | Li et al. |
| 5,891,205 | 04/1999 | Picardi et al. |
| 5,948,697 | 09/1999 | Hata |
| 5,958,228 | 09/1999 | Tokushima et al. |
| 5,958,288 | 09/1999 | Mueller et al. |
| 5,958,794 | 09/1999 | Bruxvoort et al. |
| 5,976,480 | 11/1999 | Mangold et al. |
| 5,980,775 | 11/1999 | Grumbine et al. |
| 5,997,620 | 12/1999 | Kodama et al. |
| 6,015,506 | 01/2000 | Streinz et al. |
| 6,030,425 | 02/2000 | Hata |
| 6,068,787 | 05/2000 | Grumbine et al. |
| 6,117,026 | 09/2000 | Hayashi et al. |
| 6,117,775 | 09/2000 | Kondo et al. |
| 6,117,783 | 09/2000 | Small et al. |
| 6,140,239 | 10/2000 | Avanzino et al. |
| 6,156,661 | 12/2000 | Small et al. |
| 6,159,076 | 12/2000 | Sun et al. |
| 6,214,098 | 04/2001 | Lee |
| 6,235,693 | 05/2001 | Cheng et al. |

UNITED STATES PATENT AND TRADEMARK OFFICE
CERTIFICATE OF CORRECTION

| | | |
|---|---|---|
| PATENT NO. | : 7,029,508 B2 | |
| APPLICATION NO. | : 10/361822 | |
| DATED | : April 18, 2006 | |
| INVENTOR(S) | : Brandon Shane Scott et al. | |

It is certified that error appears in the above-identified patent and that said Letters Patent is hereby corrected as shown below:

U.S. Patent Documents

| | | |
|---|---|---|
| 6,248,704 | 06/2001 | Cheng et al. |
| 6,251,150 | 06/2001 | Small et al. |
| 6,270,395 | 08/2001 | Towery et al. |
| 6,293,848 | 09/2001 | Fang et al. |
| 6,299,795 | 10/2001 | Lin et al. |
| 6,313,039 | 11/2001 | Small et al. |
| 6,332,831 | 12/2001 | Shemo et al. |
| 6,362,104 | 03/2002 | Wang et al. |
| 6,383,065 | 05/2002 | Grumbine et al. |
| 6,435,947 | 08/2002 | Mueller et al. |
| 6,468,428 | 10/2002 | Nishii et al. |
| 6,498,131 | 12/2002 | Small et al. |
| 6,541,384 | 04/2003 | Sun et al. |
| 2001/0037821 A1 | 11/2001 | Stanley et al. |

On the title page item (56), under References Cited, after the documents of the U.S. Patent Documents section, please insert the following:

Foreign Patent Documents

| | | |
|---|---|---|
| 96/38262 | 12/1996 | WIPO |
| 99/53532 | 10/1999 | WIPO |
| 01/30928 A1 | 05/2001 | WIPO |
| 01/32794 A1 | 05/2001 | WIPO |
| 02/33736 A1 | 04/2002 | WIPO |
| 0 831 136 A2 | 03/1998 | EPO |
| 0 844 290 A1 | 05/1998 | EPO |
| 0 846 742 A2 | 06/1998 | EPO |
| 0 984 048 A2 | 03/2000 | EPO |
| 1 072 662 A1 | 01/2001 | EPO |
| 1 020 488 A2 | 07/2000 | EPO |
| 1 020 501 A2 | 07/2000 | EPO |
| 1 036 836 A1 | 09/2000 | EPO |

UNITED STATES PATENT AND TRADEMARK OFFICE
CERTIFICATE OF CORRECTION

| | |
|---|---|
| PATENT NO. | : 7,029,508 B2 |
| APPLICATION NO. | : 10/361822 |
| DATED | : April 18, 2006 |
| INVENTOR(S) | : Brandon Shane Scott et al. |

It is certified that error appears in the above-identified patent and that said Letters Patent is hereby corrected as shown below:

On the title page item (56), under References Cited, after the listed documents of the Foreign Patent Documents section, please insert the following:

Other Publications

RGR Bacon, "The initiation of polymerisation processes by redox catalysts" Q. Rev. Chem. Soc., 9:287-310 (1955)

HJH Fenton, "Oxidation of tartaric acid in presence of iron" Journal of Chemical Society, 65: 899-910 (1894)

MCR Symons, "Evidence for formation of free-radical intermediates in some reactions involving periodate" Journal of the Chemical Society, 2794-2796 (1955)

Cheves Walling, "Free radicals in solution" John Wiley & Sons 564-579 (1957)

Teel et al., "Comparison of mineral and soluble iron Fenton's catalysts for the treatment of trichloroethylene" Water Research, 35(4):977-984 (March 2001)

"The Chemistry of Silica" by R. K. Iler, Wiley-Interscience Publication, 410-411 (1979)

Benjamin S. Lane and Kevin Burgess, "A cheap, catalytic, scalable, and environmentally benign method for alkene epoxidations" J. American Chem. Soc. 123 (12):2933-2934 (March 2001)

Raghunath et al., "Mechanistic aspects of chemical mechanical polishing of tungsten using ferric ion based alumina slurries" Electrochemical Society Proceedings, 96-22:1-15 (1997)

UNITED STATES PATENT AND TRADEMARK OFFICE
CERTIFICATE OF CORRECTION

PATENT NO.        : 7,029,508 B2
APPLICATION NO.   : 10/361822
DATED             : April 18, 2006
INVENTOR(S)       : Brandon Shane Scott et al.

It is certified that error appears in the above-identified patent and that said Letters Patent is hereby corrected as shown below:

Other Publications

Basak et al., "Electrochemical aspects of the chemical mechanical planarization of tungsten" Electrochemical Society Proceedings, 96-22:137-148 (1997)

Signed and Sealed this

Fifteenth Day of July, 2008

JON W. DUDAS
*Director of the United States Patent and Trademark Office*